(12) United States Patent  (10) Patent No.: US 7,755,389 B2
Murphy et al. (45) Date of Patent: *Jul. 13, 2010

(54) RECONFIGURABLE LOGIC STRUCTURES

(75) Inventors: Colin Neal Murphy, Belmont, CA (US); Narbeh Derhacobian, Belmont, CA (US); Louis Charles Kordus, II, Redwood City, CA (US); Antonietta Oliva, San Jose, CA (US); Vei-Han Chan, San Jose, CA (US); Thomas E. Stewart, Jr., Plano, TX (US)

(73) Assignee: Agate Logic, Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/350,219

(22) Filed: Jan. 7, 2009

(65) Prior Publication Data

US 2009/0134910 A1 May 28, 2009

Related U.S. Application Data

(63) Continuation of application No. 11/267,718, filed on Nov. 3, 2005, now Pat. No. 7,511,532.

(51) Int. Cl.
*H03K 19/177* (2006.01)
*G11C 11/34* (2006.01)

(52) U.S. Cl. .............. 326/41; 326/113; 326/47; 365/148; 365/154; 365/163; 257/130

(58) Field of Classification Search ............. 326/41, 326/113; 365/148, 163, 154; 257/130
See application file for complete search history.

(56) References Cited

U.S. PATENT DOCUMENTS

| | | | | |
|---|---|---|---|---|
| 2003/0021966 A1* | 1/2003 | Segal et al. | .............. | 428/209 |
| 2005/0073881 A1* | 4/2005 | Tran et al. | .............. | 365/158 |
| 2007/0058417 A1* | 3/2007 | Roehr | .............. | 365/148 |

* cited by examiner

*Primary Examiner*—Vibol Tan
(74) *Attorney, Agent, or Firm*—James M. Wu; JW Law Group

(57) ABSTRACT

Reconfigurable electronic structures and circuits using programmable, non-volatile memory elements. The programmable, non-volatile memory elements may perform the functions of storage and/or a switch to produce components such as crossbars, multiplexers, look-up tables (LUTs) and other logic circuits used in programmable logic structures (e.g., (FPGAs)). The programmable, non-volatile memory elements comprise one or more structures based on Phase Change Memory, Programmable Metallization, Carbon Nano-Electromechanical (CNT-NEM), or Metal Nano-Electromechanical device technologies.

26 Claims, 27 Drawing Sheets

|  | Anti-Fuse | EEPROM or FG-NVM | SONOS NVM | SRAM |
|---|---|---|---|---|
| LOGIC CMOS Compatible | No Extra Masks and Process Steps Needed | No Extra Masks and Process Steps Needed | No Extra Masks and Process Steps Needed | YES |
| Available in Advanced Logic Process (90nm or below) | NO | NO | NO | YES |
| # of Allowed Programming* | 1 | 500-1000 | 500-1000 | Infinite |
| Non-Volatility | YES | YES | YES | NO |
| Immunity to Radiation-Induced Soft Errors | YES | Somewhat | YES | NO |
| On-Chip Extra Circuitry Needed for High Voltage Programming | YES (up to 6V) | YES (up to 20V) | YES (up to 12V) | NO |
| Does Configuration Bit Occupy Active Silicon Area? | YES | YES | YES | YES |
| Scalability with CMOS | Difficult | Very Difficult | Difficult | Scalable |

* This refers to the number of times the device can be configured.

FIGURE 4 (PRIOR ART)

Temperature profile for crystalline and amorphous phase change. Ta and Tx are melting and crystallization temperature. t1 and t2 time control amorphous and crystallize state formation.

IV curves for crystalline (low resistance) and amorphous (high resistance) states.

| Mode Voltages | Pass Gate On | Pass Gate Off | Program ON | Program OFF |
|---|---|---|---|---|
| PG = Pass Gate | 1.3v | –0.3 | PGM | PGM |
| PGM = Program Supply | 0.5v | 0.5v | 0v --> 2v, Ilimit | 0v --> 2v, Ilimit |
| VPWR = Virtual Power | 1.3v | 1.3v | 0v | 0v |
| VGNG = Virtual Ground | –0.3v | –0.3v | 0v | 0v |
| BIP = Bias P-channel | 0.5v | 0.5v | 0v | PGM |
| BIN = Bias N-channel | 0.5v | 0.5v | 0v | PGM |

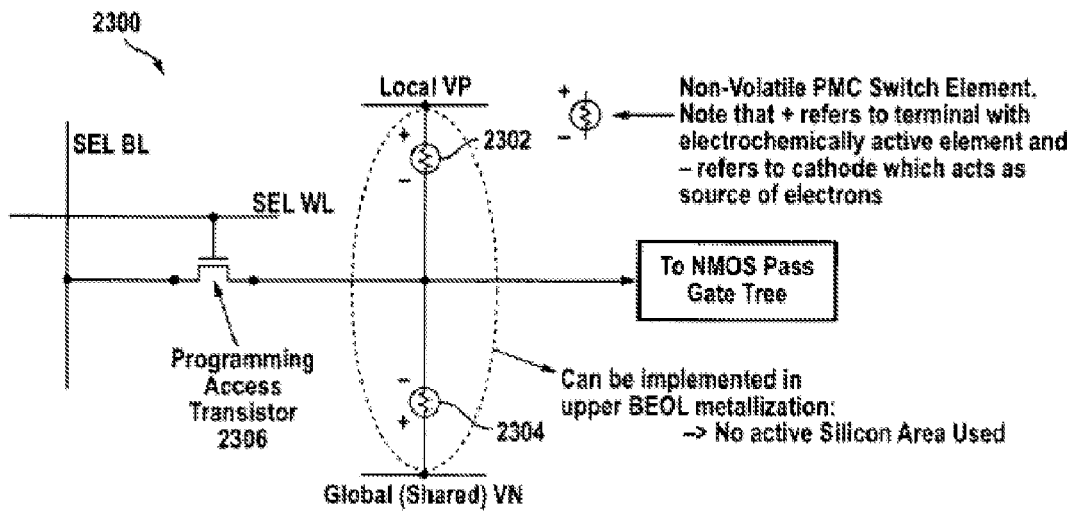

FIGURE 23A

| Operation | SEL VP | SEL BL | Shared VN | SEL WL | Comment |
|---|---|---|---|---|---|
| Prog "1" | 4VPP | 3VPP | 2VPP | VON | Close Upper Switch/ Open Lower Switch |
| Prog "0" | 0 | VPP | 2VPP | VON | Opens Upper Switch/ Closes Lower Switch |
| Inhibit Prog | 2VPP | 2VPP | 2VPP | VON | Prevent any alteration of CB |
| Static Mode | VDD | NC | 0V | 0V (Off) | Depending on the state of the resistors, either VDD or 0V will be passed on to the NMOS Pass Gate Tree. |

NOTES:
* VPP = Programming voltage needed across the terminals to switch a PMC cell.
* "Shared" implies that all the CB in the device will have the same bias hence no select circuitry is needed.
* "SEL" means that local selection and decoding will be needed to select individual CBs.
* To Close a Switch implies that the electrical link has been established inside the solid electrolyte. Similarly, to open a switch implies that the link is broken and the cell is in high resistance mode.

FIGURE 23B

| | Write 1 | Write 0 | Read after Write 1 | Read after Write0 |
|---|---|---|---|---|
| WriteB | 0v | 0v | 1.2 | 1.2 |
| Read | 0v | 0v | 1.2 | 1.2 |
| Vpp | 2.5v | 2.5v | 0v | 0v |
| V1 | 0v | NC | 1.2v | 1.2v |
| V0 | NC | 0v | 0v | 0v |
| Out | NC | NC | 1.2-Vt | 0 |

| | Write 1 | Write 0 | Read after Write 1 | Read after Write0 |
|---|---|---|---|---|
| W0B | 1.2v | 0v | 1.2 | 1.2 |
| W1B | 0v | 1.2v | 1.2 | 1.2 |
| Vpp | 2.5v | 2.5v | 0v | 0v |
| Vhigh | 0v | 0v | 1.2v | 1.2v |
| Vlow | 0v | 0v | 0v | 0v |
| Read | 0v | 0v | 1.2v | 1.2v |
| Out | NC | NC | 1.2-Vt | 0 |

RECONFIGURABLE LOGIC STRUCTURES

CROSS-REFERENCE TO RELATED PATENT APPLICATIONS

This application is a continuation of prior application Ser. No. 11/267,718, filed on Nov. 3, 2005, now U.S. Pat. No. 7,511,532 the disclosure of which is hereby incorporated by reference.

FIELD OF THE INVENTION

The present invention relates to programmable logic devices and other programmable structures. More specifically, the present invention relates to programmable logic structures using phase change material devices and other non-volatile, reconfigurable device technologies.

BACKGROUND OF THE INVENTION

Digital electronic systems are comprised of essentially three different types of components: memory, microprocessor, and logic components. Memory devices store information such as, for example, the contents of a spreadsheet or database. Microprocessors execute software instructions to perform a wide variety of tasks such as running a word processing program or video game. Logic devices provide specific functions, including device-to-device interfacing, data communication, signal processing, data display, timing and control operations, and almost every other function a system must perform.

Logic devices may include either fixed or programmable functions. Fixed logic devices, as the name suggests, are permanent and perform a predetermined function or set of functions. Once manufactured, these functions cannot be altered. By contrast, programmable logic devices offer a wide range of possible logic functions, which can be programmed and altered by a designer to perform desired logic functions.

There are various types of programmable logic devices, including the Programmable Logic Arrays (PLA), Programmable Array Logic (PAL), the Programmable Logic Device (PLD), and the Complex Programmable Logic Device (CPLD). Common among these programmable logic devices is some form of logical planes, i.e., array of AND, OR functional gates, that contain some mechanism for programming (and in some instances, even reprogramming) one or more desired logic functions. For example, FIG. 1 shows a basic schematic of a PLA logic block that contains an AND array and an OR array with programmability in both planes. The "Xs" indicate where connections may be made between the wires. As can be seen, three different logic operations can be attained using this basic PLA logic block.

Early programmable logic device architectures, including the technologies used to implement their programmability, were often not up to par with their application specific integrated circuit (ASIC) counterparts. In fact, not until the introduction of the CPLD did programmable logic devices achieve wide market adoption. A CPLD consists of three principal component types: logic blocks, programmable interconnects, and input/output (I/O) blocks. The programmable interconnect matrix in a CPLD is typically configured so that it is capable of connecting any input or output of a given logic block to any input or output of another logic block.

FIG. 2A is an architectural diagram of a commercially available CPLD 20 manufactured by Altera Corporation. The CPLD 20 comprises an array of blocks, referred to as Logic Array Blocks (LABs) 200, interconnect wires, referred to as a Programmable Interconnect Array (PIA) 202. The PIA 202 is capable of interconnecting any LAB input or output to any other LAB. Each LAB 200 includes a plurality of "macrocells" 204, which can be configured to perform various combinatorial or sequential logic functions. Each macrocell 204 comprises a set of programmable product terms (part of an AND-plane) that feed an OR-gate and a flip-flop. As illustrated in FIG. 2B, the number of inputs to the OR-gate in a given macrocell is variable, and may be programmed so that the CPLD performs desired combinatorial or sequential logic functions.

Another user-programmable integrated circuit that is in widespread use is the Field Programmable Gate Array (FPGA). One of the principal benefits of FPGAs over other programmable device structures (such as those discussed above) is that FPGAs support a much higher logic capacity. As shown in FIG. 3, a typical FPGA 30 comprises three types of configurable elements: configurable logic blocks 300 arranged in a two-dimensional array, input/output (I/O) blocks 302, and programmable interconnects 304. The logic blocks 300 provide the functional elements for implementing a user's design; the I/O blocks 302 provide an interface between the package pins and the internal signal lines of the integrated circuit; and the programmable interconnects 304 provide routing paths to connect the inputs and outputs of the logic blocks 300 and I/O blocks 302.

There are many architectural styles used to implement an FPGA. A key distinguishing feature among the various styles is the type of programmable switching device used to configure (i.e. program) the FPGA. The main programmable switch technologies are: antifuse, EEPROM (electrically erasable programmable read only memory) or floating gate (FG) non-volatile memory (NVM), SRAM (static random access memory), and SONOS (silicon-oxide-nitride-oxide-silicon) based NVM. Each of these technologies can be used to form a programmable switch capable of storing logic "1" and logic "0" states. The logic states of a plurality of these programmed switches determine the configuration settings of the logic blocks of the FPGA, and consequently the logic functions provided by the FPGA.

FIG. 4 is a table comparing various integration and performance characteristics of the four main programmable switch technologies. As can be seen, use of each of the technologies presents benefits as well as drawbacks. For example, while SRAM programmable switch technology is compatible with CMOS (Complementary Metal Oxide Semiconductor) technology, and may even be available in advanced 90 nm or below CMOS technologies, the anti-fuse, EEPROM/FG and SONOS NVM technologies are not. Anti-fuse, EEPROM/FG and SONOS NVM technologies require extra masking and/or special processing steps beyond that used in established CMOS processes. Anti-fuse, EEPROM/FG and SONOS NVM technologies also have a limited lifespan, since they can be reprogrammed only a finite number of times; require special charge pump circuitry to generate the high voltages needed for programming; and are difficult to scale with CMOS scaling. These drawbacks, particularly when weighed against the benefits gained by use of SRAM technology has led SRAM to become the leading programmable switch technology used in FPGAs. SRAM is compatible with existing CMOS processing technologies, may be fabricated in advanced logic fabrication processes (e.g. 90 nm or below), and can be easily scaled along with the scaling of a CMOS process. For these reasons, most commercially available FPGAs use SRAM-based programmable switching technology.

FIG. 5 is a circuit diagram of a programmable switch 50 using a conventional 6T SRAM cell. The 6T SRAM cell comprises two cross-coupled CMOS inverters (two transistors each) 500, 502 and two access transistors 504, 506. The SRAM cell 50 is coupled to the control input (i.e. gate) of an NMOS passgate 508. When a logic one is stored in the SRAM cell 50, the NMOS passgate 508 acts as a closed switch. On the other hand, when a logic zero is stored in the SRAM cell 50, the NMOS passgate 508 acts as an open switch.

6T SRAM cells are used extensively in standard FPGAs. Not only are they used to control passgates, as described in the previous paragraph, they are also used as "configuration bits" that control select lines of multiplexers which drive the logic blocks of the FPGA. FIG. 6 illustrates these two functions in a typical FPGA 60. First and second 6T SRAM cells 600 and 602 control respective passgates 604 and 606, to connect a first logic block 608 located in the upper left hand corner (represented by the AND gate) of the FPGA 60 to a second logic block 610 located in the lower right hand corner of the FPGA 60. A third 6T SRAM configuration bit 612 controls a multiplexer 614, to complete the connection between the first logic block 608 and the second logic block 610.

FIG. 7 is a drawing illustrating how 6T SRAM configuration bits are connected to and control the selection in a 4:1 multiplexer. The 4:1 multiplexer 70 is similar to that found in a typical SRAM-based FPGA. The 4:1 multiplexer has four inputs 700 (also labeled In0, In1, In2, In3) coupled to respective input buffers 702 and an output 704 (also labeled "Out0"). NMOS passgate transistors 704 are coupled between each of the four input buffers 702 and an output buffer 706. Four 6T SRAM cells 708 are coupled to the gates of NMOS passgate transistors 704. Together, the 6T SRAM cells 708 and NMOS passgate transistors 704 form 6T SRAM configuration bits, which control which of the four inputs 700 is routed to the output 704. So, for example, if the logic state of the 6T SRAM cell second from the right stores a logic "1", and the remaining 6T SRAM cells store a logic "0", then the input 700 that is second from the bottom (i.e. input In2) is routed to the output 704.

Another common circuit found in FPGAs is the look-up table (or "LUT"). A LUT performs a variety of Boolean logic functions based on the states and selection of a plurality of memory elements. In SRAM-based FPGAs, the memory elements are 6T SRAM cells. FIG. 8 is an architectural drawing of a logic block 80 of an SRAM-based FPGA, which illustrates the relationship between a LUT 800 and other components of the logic block 80. The four-input LUT 800 implements four input combinational logic functions. A first configuration bit 802 selects a desired logic function from the LUT 80. A multiplexer 804, which is controlled by a second configuration bit 806, is used to select either the LUT output or the output of an optional flip-flop (or "latch") 808.

FIG. 9 is a more detailed drawing of a typical prior art SRAM-based LUT 90. A plurality of 6T SRAM memory elements is coupled to a chain of NMOS pass-gates. Select lines In1, In2, In3, In4 are coupled to the gates of the chain of NMOS pass-gates. The desired Boolean function is determined by the logic values set on select lines, In1, In2, In3, In4 and the logic values stored in the selected memory elements.

Although SRAM-based programmable switch technology has become the preferred programmable switch technology, its use does present other drawbacks. One major drawback of SRAMs is that they occupy a large percentage of the programmable fabric of an SRAM-based FPGA. A single 6T SRAM configuration bit has seven active devices, six to implement the SRAM cell and a seventh for the passgate. Hence, even a single 6T SRAM configuration bit occupies a significant amount of base silicon. This problem is compounded by the fact that present day SRAM-based FPGAs can contain ten to fifty million SRAM cells. Accordingly, SRAM-based FPGAs, although offering many benefits, have the serious drawback of the SRAM cells consuming a large portion of the FPGA chip area. As shown in FIG. 10, the SRAM cells, associated MOS passgates and error correction circuitry may consume 70% or more of the programmable blocks of the FPGA.

SRAMs are also susceptible to radiation-induced soft errors. A radiation-induced soft error occurs when neutrons or alpha particles from the environment impinge on the SRAM and cause it to change state. To prevent radiation-induced errors, special error correction circuitry is routinely included with the SRAM cells.

Finally, SRAM-based FPGAs are volatile (see FIG. 4), meaning that the SRAM-based configuration bits must be reprogrammed (i.e. reconfigured) every time the FPGA is powered down and then powered up again. To compensate for this volatility aspect, the configuration bits may be, as is currently done, programmed into a configuration memory (e.g. non-volatile memory). During boot up, the configuration memory provides the configuration bits needed to configure the desired logic functions. In addition to the drawback of having to wait for the FPGA to be configured to boot-up, large amounts of power are needed to complete the boot up process. Because the states of the various SRAMs in SRAM based FPGA are random at power-up, and there are millions of SRAMs on a typical SRAM-based FPGA, there is a chance that most of the SRAMs are in the same state at the initial stages of power-up. Under these conditions, large currents can be generated in the FPGA. To avoid such high current conditions, special power supply and control circuitry must be employed to ensure that configuration is done properly and without damaging the FPGA. The need for special power supply and control circuitry adds further complexity and cost to systems using SRAM-based FPGAs.

Given the foregoing limitations and drawbacks of prior art programmable logic structures, it would be desirable to have a programmable logic structure, for example an FPGA, that is reconfigurable, uses non-volatile memory elements, is radiation hard, and can be more densely integrated than currently available programmable logic structures.

SUMMARY OF THE INVENTION

Reconfigurable electronic structures and other circuits using programmable, non-volatile memory elements are disclosed. The programmable, non-volatile memory elements may perform the functions of storage and/or a switch to produce components used in programmable logic structures, such as crossbars, multiplexers, look-up tables (LUTs) and other logic circuits used in field programmable gate arrays. The programmable, non-volatile memory elements comprise one or more structures based on Phase Change Memory (PCM), Programmable Metallization Device (PMD), Carbon Nanotube Nano-Electromechanical (CNT-NEM), or Metal Nano-Electromechanical device technologies.

Other aspects of the invention are described and claimed below, and a further understanding of the nature and advantages of the inventions may be realized by reference to the remaining portions of the specification and the attached draw-

BRIEF DESCRIPTION OF THE DRAWINGS

FIG. 4 is a table comparing various integration and performance characteristics of four main prior art programmable switch technologies;

FIG. 23A is a schematic diagram of a non-volatile, reconfigurable configuration bit utilizing PMDs, according to an embodiment of the present invention;

FIG. 23B is a table listing voltages applied to various nodes of the PMD-based configuration bit in FIG. 23A for different modes of operation;

DETAILED DESCRIPTION

Figure 11:
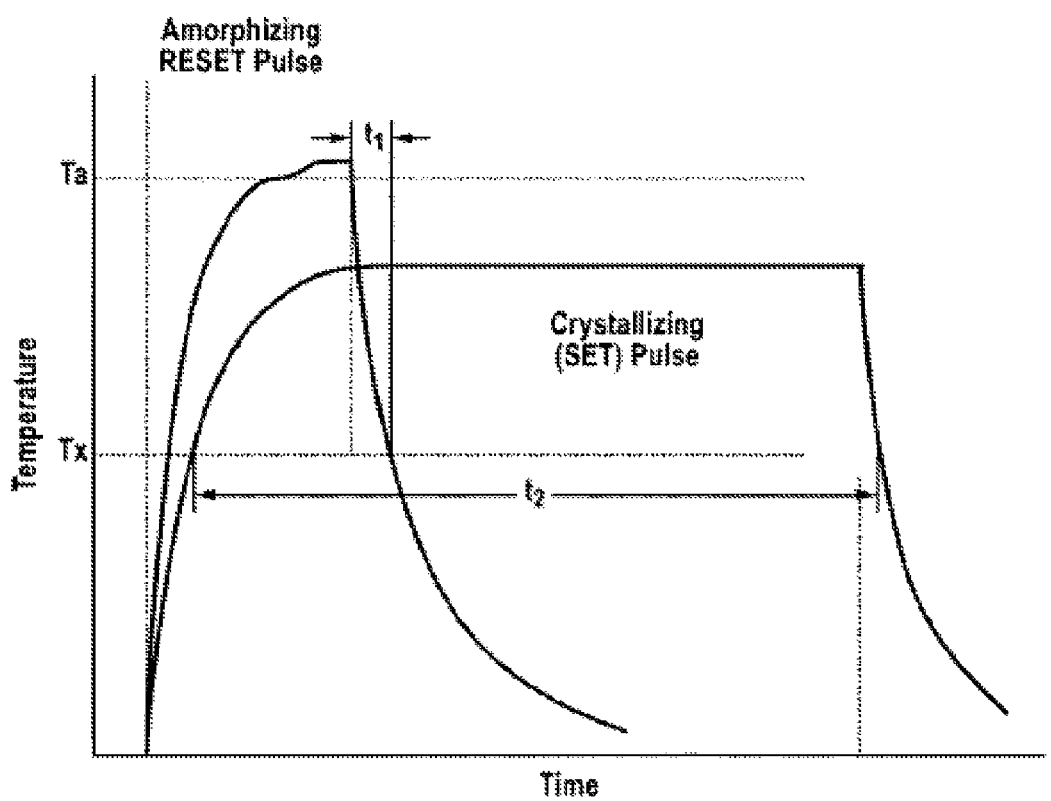
FIG. 11 is a temperature v. time profile of a phase change material (PCM), illustrating crystalline and amorphous phase changes, and cooling times that control crystalline and amorphous state formation.
Figure 12:
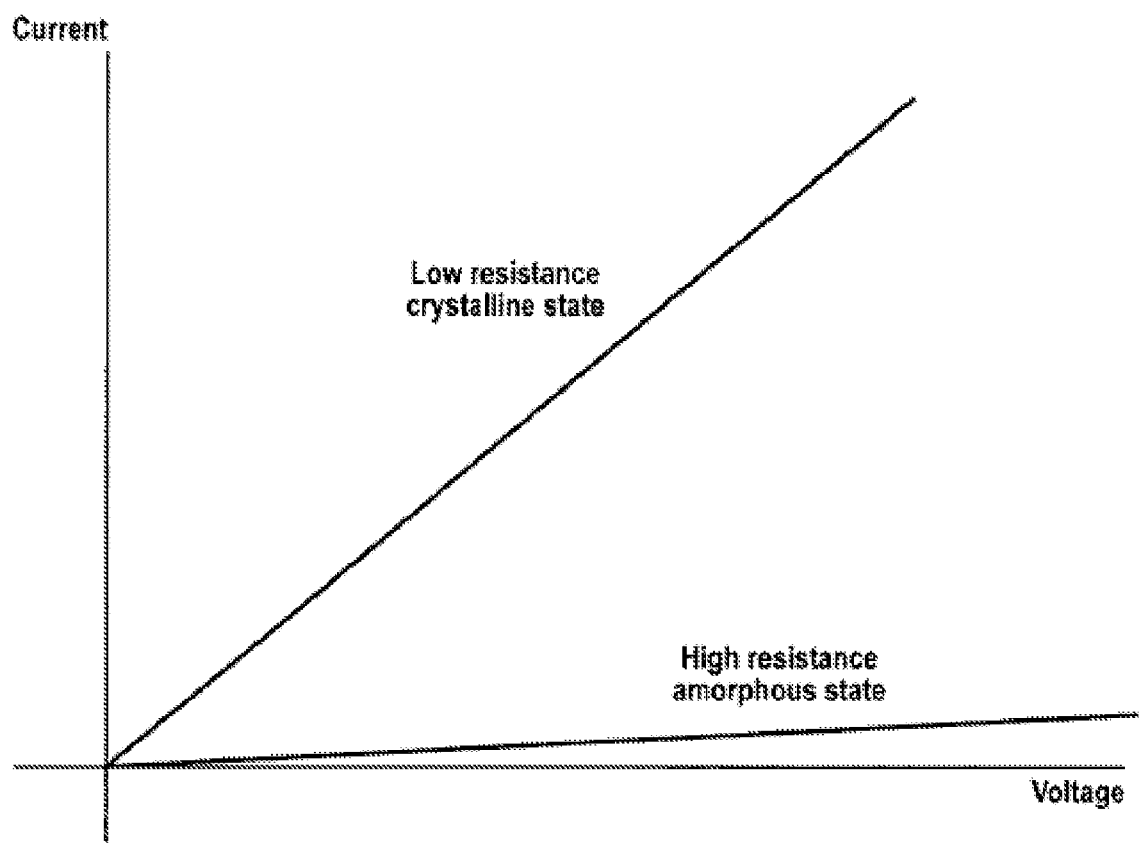
FIG. 12 is a drawing of the I-V curves for the crystalline (low-resistance) and amorphous (high-resistance) states of a PCM.

According to a first aspect of the invention, phase change material devices are used to implement programmable, non-volatile memory elements, which can be used in reconfigurable logic structures. Phase change materials (PCMs) are a class of materials that can change phase from crystalline structures to amorphous structures and vice versa when under different thermal treatments as shown in FIG. 11. When a PCM is heated above its crystallization temperature and cooled down gradually, it solidifies to a crystalline phase and exhibits low electrical resistance. However, when heated above its melting temperature and then cooled down abruptly, the PCM forms an amorphous phase and exhibits high electrical resistance. Accordingly, a PCM may be viewed as a programmable resistor having two distinct electrical resistance values as shown in FIG. 12. PCMs may contain atomic elements from Groups IV, V and VI of the periodic table of elements, such as Ge, As, Se, Te. When formed in an integrated circuit, electric currents are used to introduce joule heating into the PCMD to convert between the crystalline and amorphous states. As explained in detail below, these properties can be exploited to form PCMDs capable of storing digital logic states in circuits used in programmable logic structures. For example, such devices may be used to configure logic and/or connect/separate routing nets in a Field Programmable Gate Array (FPGA).

Figure 13:
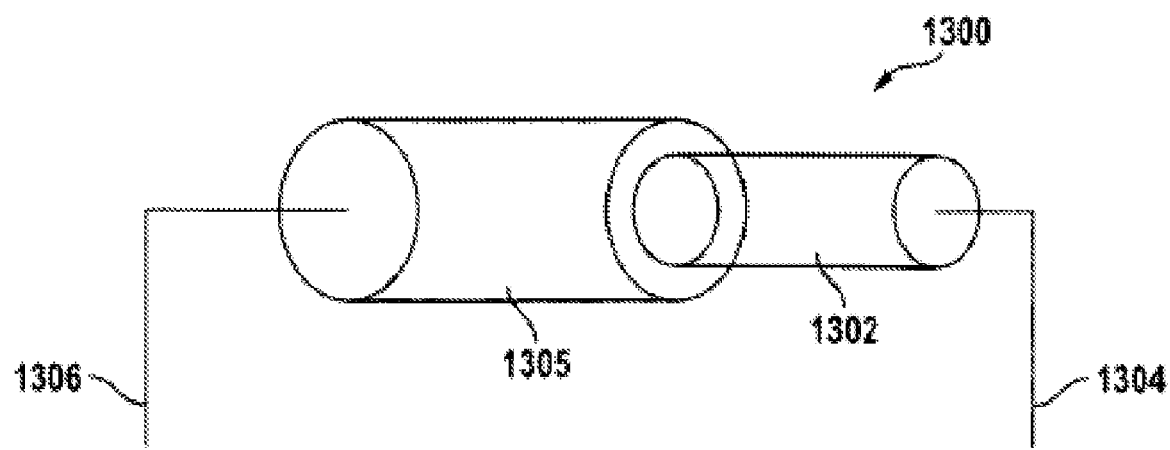
FIG. 13 is a simplified diagram of a two-terminal PCMD.
Figure 14:
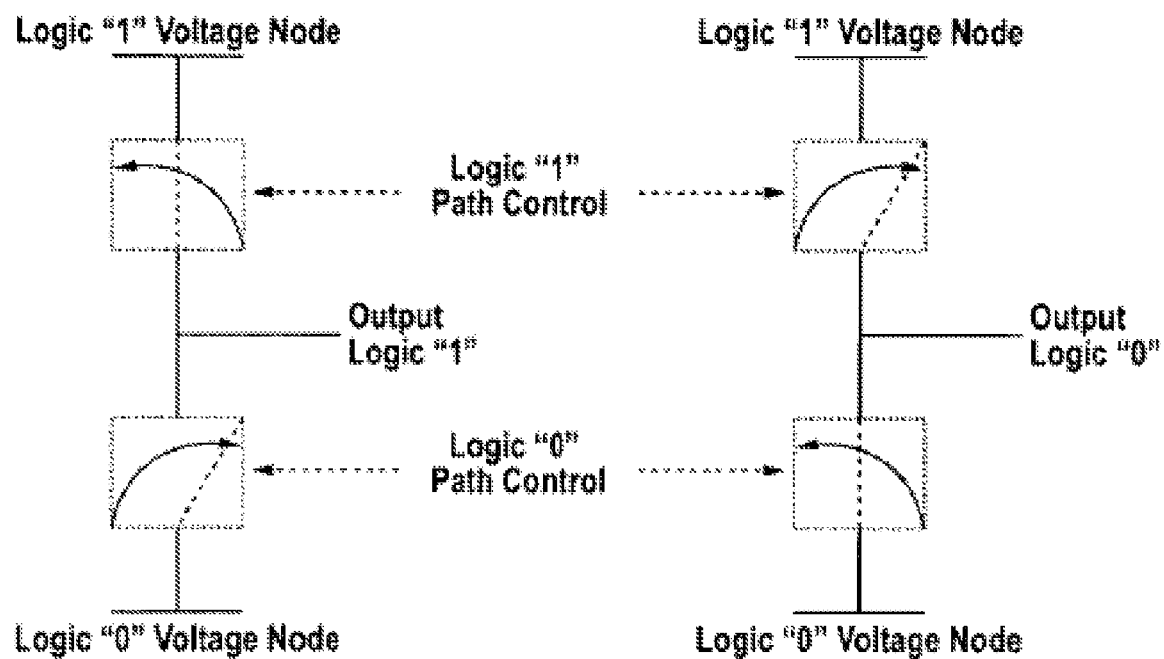
FIG. 14 is a drawing of a PCMD, according to an embodiment of the present invention, illustrating the generation of logic "0" and logic "1" logic states.
Figure 14A:
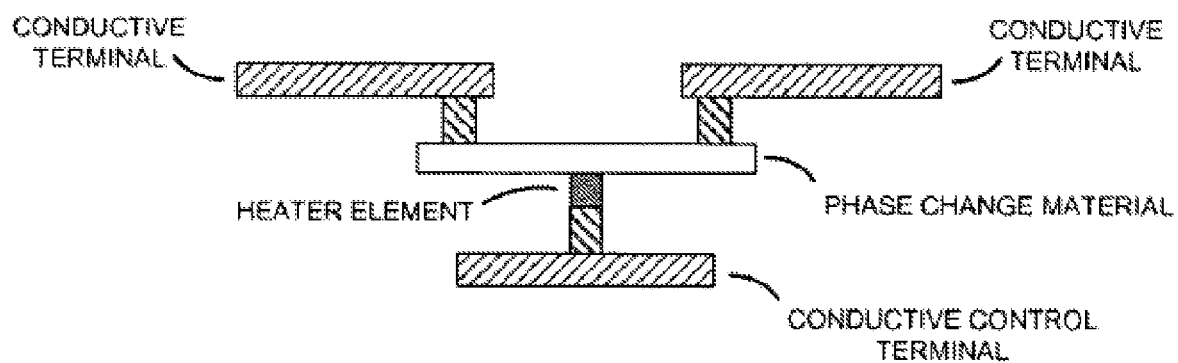
FIG. 14A is a drawing of a multi-terminal PCMD that may be used in the various reconfigurable logic structures disclosed herein.

FIG. 13 is simplified diagram of a two-terminal PCMD 1300. A heater element 1302 is attached to a first terminal 1304 of the device 1300, and the PCM 1305 is attached to a second terminal 1306 of the device 1300. The heater element 1302 generates joule heating required to make the phase change. Further details and examples as to how such a phase change device may be constructed are described in S. Lai, T. Lowrey, "OUM—A 180 nm nonvolatile memory cell element technology for stand alone and embedded applications", 2001 IEDM Technical Digest, pp. 36.5.1-36.5.4; J. Maimon, J. D., K. Hunt, L. Burcin, J. Rodgers, "Chalcogenide memory arrays: characterization and radiation effects", IEEE Transactions on Nuclear Science, v. 50, n. 6, 2003, pp. 1878-1884, December 2003; and F. Pellizzer et al., "Novel .μtrench phase-change memory cell for embedded and stand-alone non-volatile memory applications", 2004 Symposium on VLSI Technology Digest of Technical Papers, pp. 18-19, which are incorporated herein by reference to the extent that they do not conflict with this disclosure. Whereas two-terminal PCMDs similar to that shown in FIG. 13 are described as implementing or comprising portions of the various reconfigurable logic structures disclosed herein, as shown in FIG. 14A the PCMDs may comprise multi-terminal PCMDs of or similar to the type disclosed in co-pending and commonly assigned U.S. patent application Ser. No. 11/267,788 entitled "Multi-Terminal Phase Change Devices" and U.S. patent application Ser. No. 11/267,789 entitled "Methods for Fabricating Multi-Terminal Phase Change Devices", both of which are incorporated into this disclosure by reference.

Figure 15:
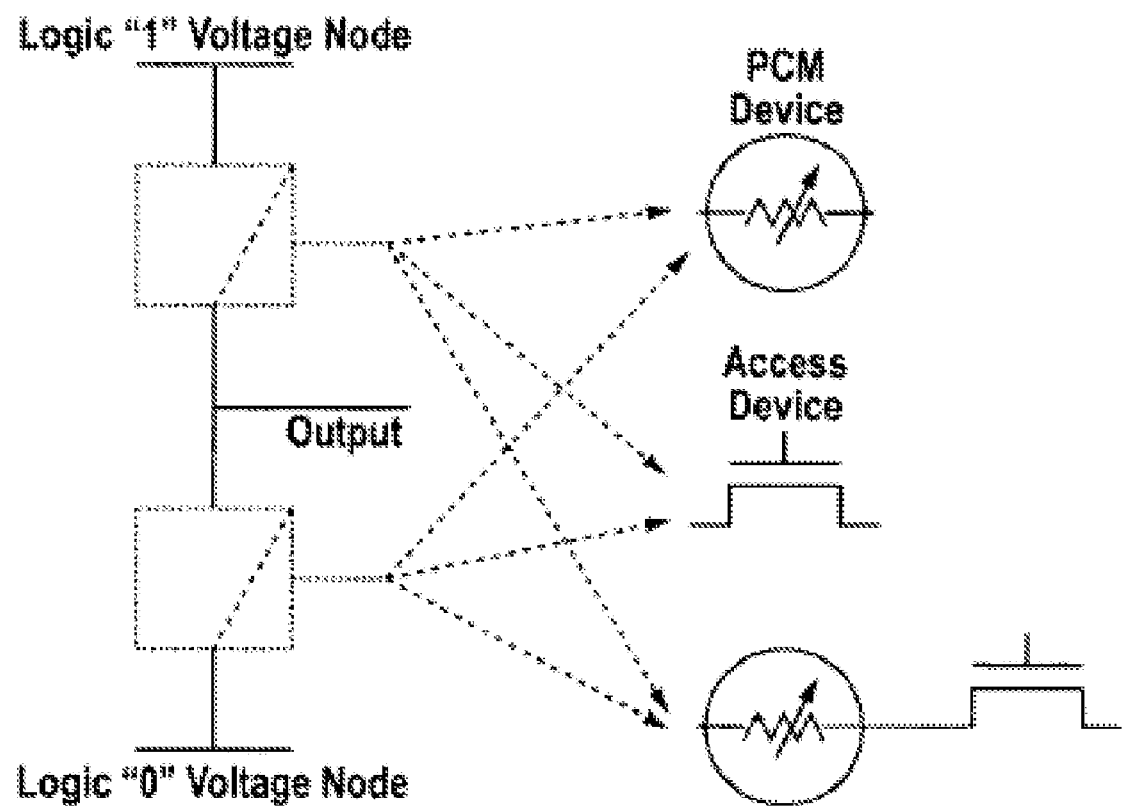
FIG. 15 is a drawing illustrating how the phase change device in FIG. 14 may also contain one or more MOS access devices, in addition to the PCMDs.
Figure 16:
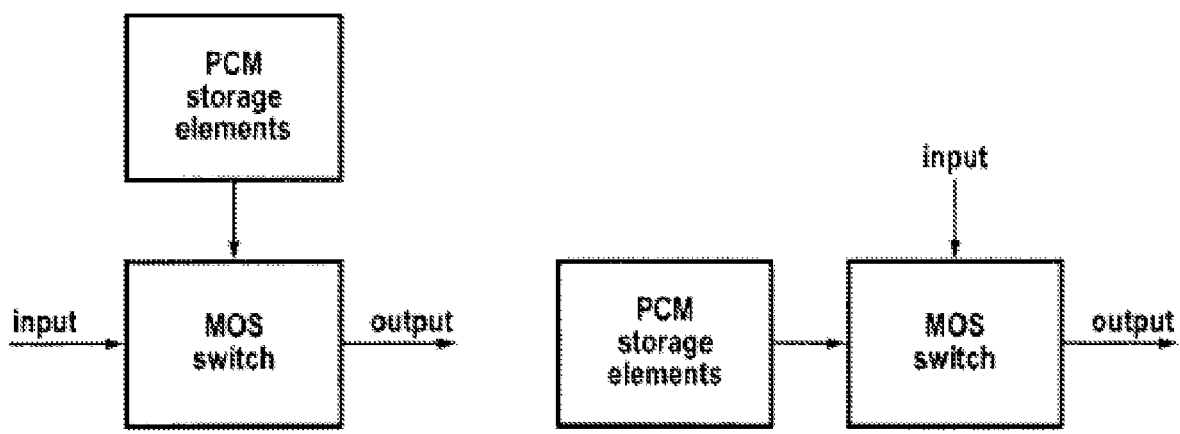
FIG. 16 illustrates how PCM storage elements may be configured as basic building blocks to form basic configuration elements for programmable gate arrays.

There are a variety of ways to form storage elements based on the two-terminal device shown in FIG. 13. According to an aspect of the present invention, two separate paths may be formed to connect the output of the storage element either to a logic "1" or to a logic "0" voltage node, as shown in FIG. 14. Either path can be configured to contain a phase change device, an access device, or combination of both, as shown in FIG. 15. Whether the output is connected to a logic "1" or a logic "0" node depends on the resistance from the output to the respected node. So, for example, if the resistance of the logic "1" path is smaller than the resistance of the logic "0" path, the output will swing closer to logic "1". Because the resistance of phase change devices can be programmed, the output can be tuned as well. Additional devices can be attached to the network for access, program, voltage conversion, and feedback purposes. In addition to phase change devices, other devices such as MOSFETs, bipolar junction transistors, etc. may be included in this storage element. As shown in FIG. 16, the resulting storage elements can be put into the basic building blocks to form basic configuration elements in programmable gate arrays. According to alternative embodiments the MOS switch shown in FIG. 16, can be replaced by one or more phase change material devices or any one or more of the other reconfigurable, nonvolatile devices described throughout this disclosure.

Figures 17A, 17B:
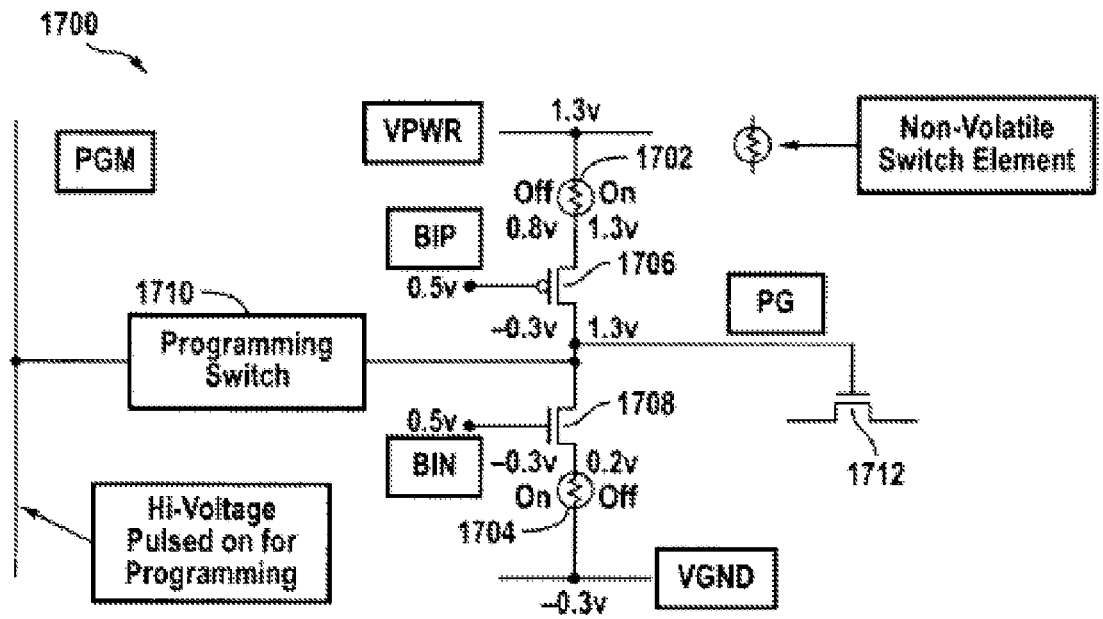
FIG. 17A is schematic diagram of an exemplary non-volatile, reconfigurable configuration element (or "configuration bit") containing PCMDs, according to an embodiment of the present invention.
FIG. 17B is a table showing exemplary applied and observed voltages in the configuration bit shown in FIG. 17A for various modes of operation, including normal operating conditions and during programming.

FIG. 17A shows an exemplary non-volatile, reconfigurable, configuration element (or "configuration bit") 1700 having PCM storage elements 1702 and 1704, according to an embodiment of the present invention. A plurality of these configuration elements, or similar configuration elements, may be configured to function as the configuration elements of the routing fabric of a programmable logic structure (e.g. an FPGA). However, the configuration element may also be used in other devices and applications, e.g., to set a bias voltage to one of two predetermined states. Additionally, while PCMD storage elements are used, as explained in more detail below, the same or similar circuit may use other alternative non-volatile, reconfigurable memory type elements such as programmable metallization devices (PMDs), carbon nanotube (CNT) nano-electromechanical (NEM) structures, and metal NEM structures.

The configuration bit 1700 comprises a first and second non-volatile PCMDs 1702 and 1704, a PMOS biasing and program voltage steering transistor (or BIP transistor) 1706, an NMOS biasing and program voltage steering transistor (or BIN transistor) 1708, a programming switch 1710, and a MOS passgate 1712. The first non-volatile PCMD 1702 is coupled between a virtual power line (VPWR) and the source of PMOS biasing and program voltage steering transistor 1706. The second non-volatile PCMD 1704 is coupled between a virtual ground line (VGND) and the source of NMOS biasing and program voltage steering transistor 1708. The drains of the PMOS and NMOS biasing and program voltage steering transistors 1706, 1708 are coupled to the gate input of MOS passgate 1712 at a passgate node (PG). The programming switch 1710 is coupled between the passgate node PG and a program supply line (PGM).

FIG. 17B is a table showing exemplary applied and observed voltages in the configuration bit during normal operating conditions and during programming. The first two columns in the table labeled "Pass Gate On" and "Pass Gate Off" list the operating voltages of the configuration bit 1700, once the first and second PCMDs 1702, 1704 have been programmed to their desired open or closed states. The third and fourth column in the table list the operating voltages used to place the configuration bit 1700 in an ON or OFF condition. Specifically, the third column shows the voltages applied to the various inputs of the configuration bit 1700 during a programming operation, in which the first PCMD 1702 is programmed so that it is in a closed state.

To start the Program ON operation, the programming switch 1710 is closed, and the gates of the PMOS and NMOS biasing and program voltage steering transistors 1706, 1708 are coupled to ground potential. This causes the NMOS biasing and program voltage transistor 1708 to turn off and the PMOS biasing and program voltage transistor 1706 to turn on. The VPWR power line is also connected to ground potential, thereby setting up a current path between the PGM voltage supply and the VPWR power line, via the first PCMD 1702. Because the voltage applied to the NMOS biasing and program voltage transistor 1708 is low, there is no current path formed through the second PCMD 1704. Current flowing through the first PCMD 1702 creates joule heating, as described above. Once sufficient joule heating has been applied to transform the PCM of the first PCMD 1702 into an amorphous state, the PGM supply is slowly ramped down so that the PCM of the first PCMD 1702 crystallizes to a low-resistance state. Following the Program ON operation, the mode voltages are set to the voltages listed in the first column of the table (i.e. the "Pass Gate On" mode). As can be seen, the voltage at the PG node is now at 1.3 V, which turns the MOS passgate 1712 on.

To perform the Program OFF operation, the first PCMD 1702 is programmed similar to that described above, except that the PGM supply is abruptly removed after joule heating so that the PCM of the first PCMD 1702 solidifies into a high-resistance amorphous state. The second PCMD 1704 is then programmed, according to the programming mode voltages in the fourth column of the table. Specifically, the gates of the PMOS and NMOS biasing and program voltage transistors 1706, 1708 transistors are coupled to the PGM supply voltage. This causes the NMOS biasing and program voltage transistor 1708 to turn on and the PMOS biasing and program voltage transistor 1706 transistor to turn off. The VPWR power line is also connected to ground potential, thereby setting up a current path between the PGM voltage supply and VGND, via the second PCMD 1704. Because the voltage applied to the PMOS biasing and program voltage transistor 1706 is high, there is no current path formed through the first PCMD 1702. Current flowing through the second PCMD 1704 creates joule heating, as described above. Once sufficient joule heating has been applied to transform the PCM of the second PCMD 1704 into an amorphous state, the PGM supply is slowly ramped down so that the PCM of the second PCMD 1704 crystallizes to a low-resistance crystalline state. Following the Program OFF operation, the mode voltages are set to the voltages listed in the second column of the table (i.e. the "Pass Gate Off" mode). As can be seen, the voltage at the PG node is now at −0.3 V, which turns the MOS passgate 1712 off.

It should be emphasized here that the configuration bit shown in FIG. 17A is presented and described herein merely to illustrate how PCMDs may be used to implement a configuration bit for a programmable logic structure. In other words, it is an exemplary embodiment and should not be viewed as the only way of forming a configuration bit using PCMDs. Those of ordinary skill in the art will readily understand and appreciate, after reading this disclosure, that other circuit configurations may be implemented to form the reconfigurable, non-volatile configuration bit using PCMDs. For example, bias voltages of 0.5 V are applied to the PMOS and NMOS biasing and program voltage transistors 1706, 1708 during normal operation to limit the voltage applied across the first and second PCMDs 1702, 1704. This biasing arrangement ensures that the "on" (i.e. low-resistance) PCMD has virtually no current flow through it during normal operation. In some applications, such biasing may not be necessary. Accordingly, the configuration bit architecture shown in FIG. 17A should not be used to limit the invention, should be considered merely an exemplary embodiment, and should not be used to limit the fundamental idea of using PCMDs to form a configuration bit.

Finally, the mode voltages shown in the table in FIG. 17B are presented merely to illustrate the programming and operating conditions of the configuration bit 1700. Those of ordinary skill in the art, after reading this disclosure, will readily appreciate and understand that other supply, programming and bias voltages may be used depending on design specifications and/or application requirements. Accordingly, the configuration bit mode voltages should be considered only as examples, and should not be used to limit the fundamental idea of using PCMDs to form a configuration bit.

The configuration bit using PCMDs results in a substantial silicon area savings. The PCMD-based configuration bit of the present invention uses less active devices than SRAM-based configuration bits and, therefore, occupies substantially less area than SRAM-based configuration bits, which require at least seven active devices per configuration bit. In some applications, the area savings can be even up to a 50% improvement. The PCMD-based configuration bit of the present invention is also not only reprogrammable, it is non-volatile, radiation hard and can be implemented in standard CMOS processes without major difficulty.

Figure 1:
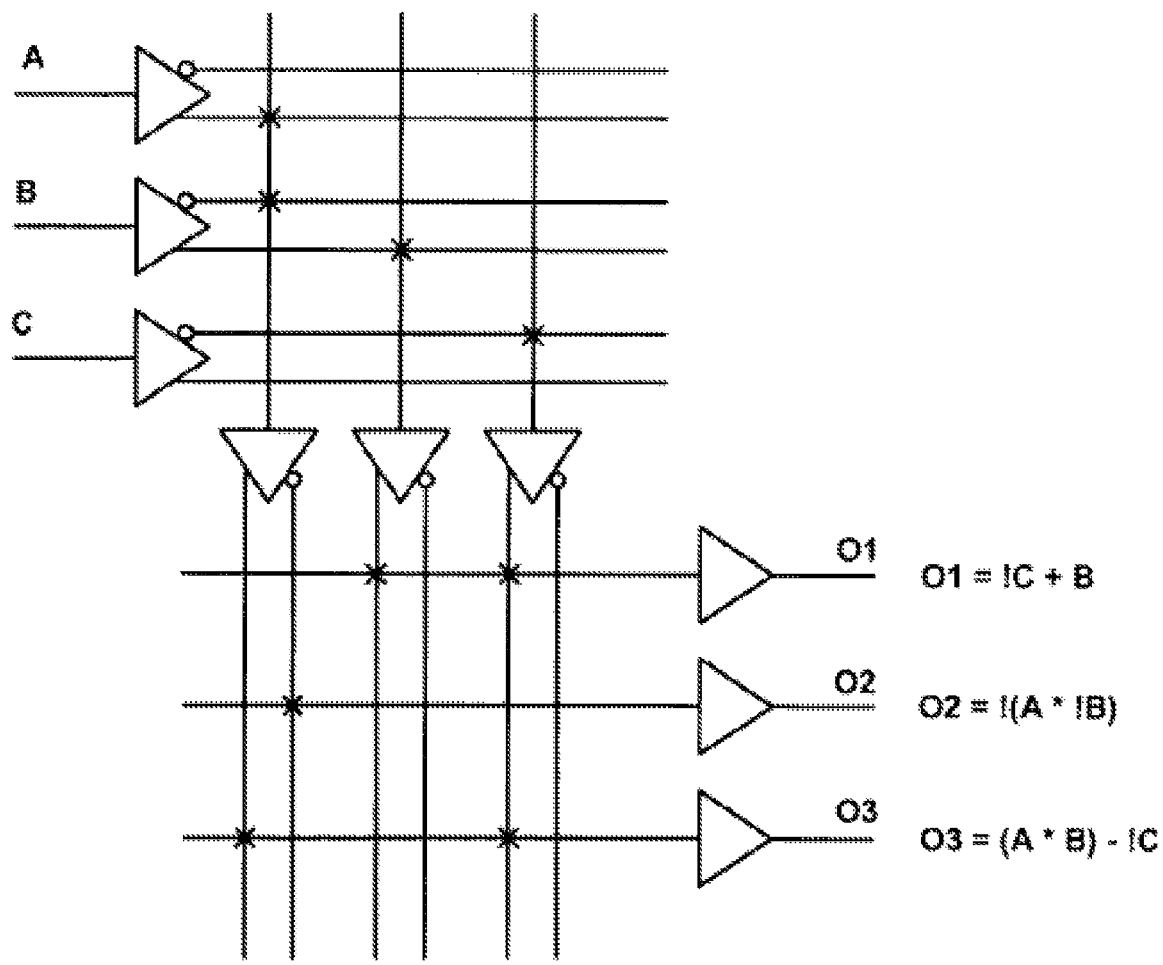
FIG. 1 is a schematic diagram of a prior art Programmable Logic Array (PLA)
Figure 2A:
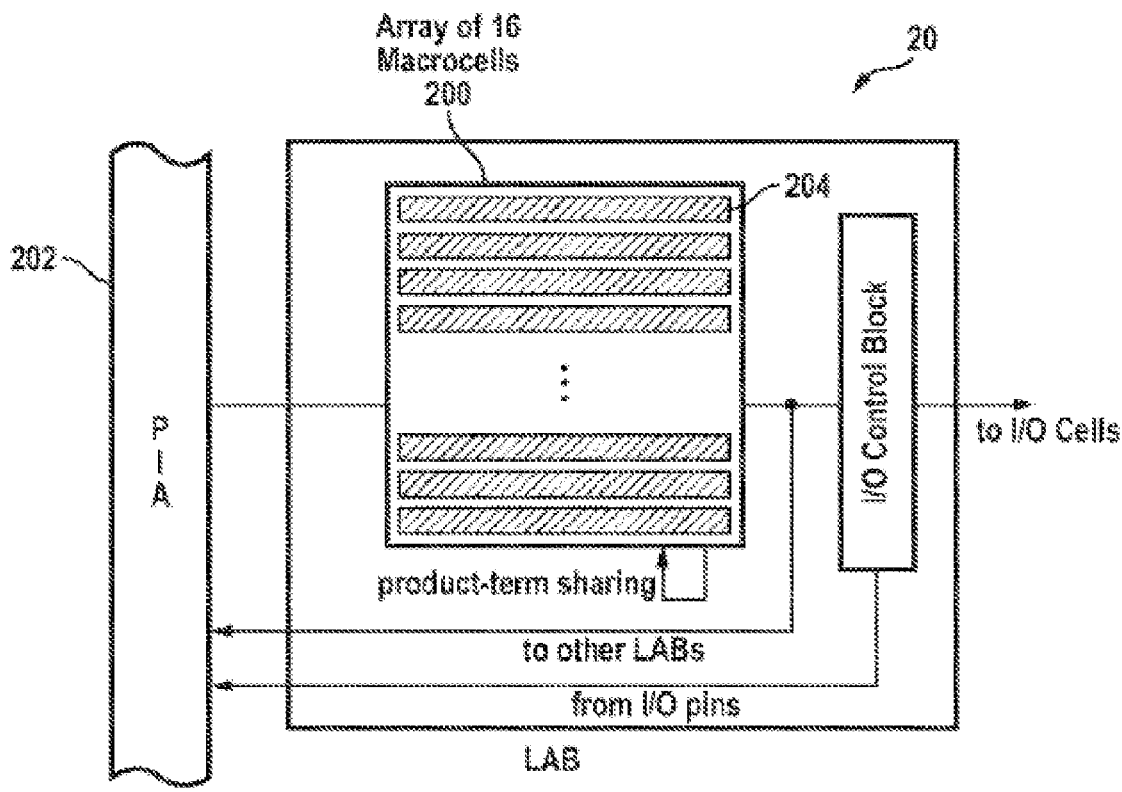
FIG. 2A is an architectural diagram of a prior art complex programmable logic device (CPLD)
Figure 2B:
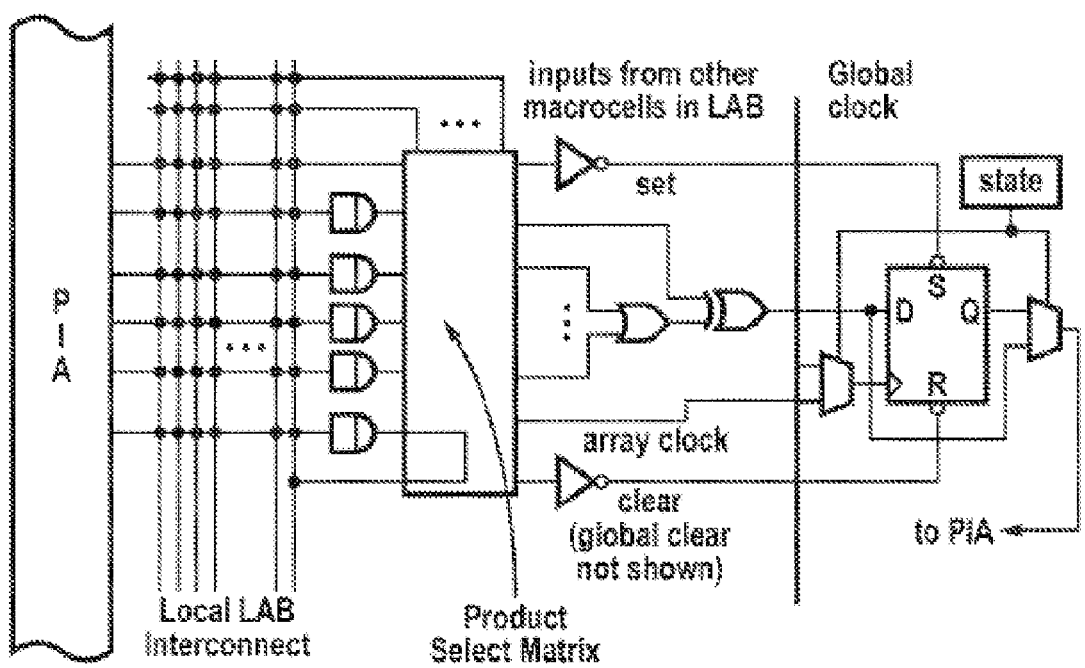
FIG. 2B is a more detailed schematic diagram of the prior art CPLD shown in FIG. 2A.
Figure 3:
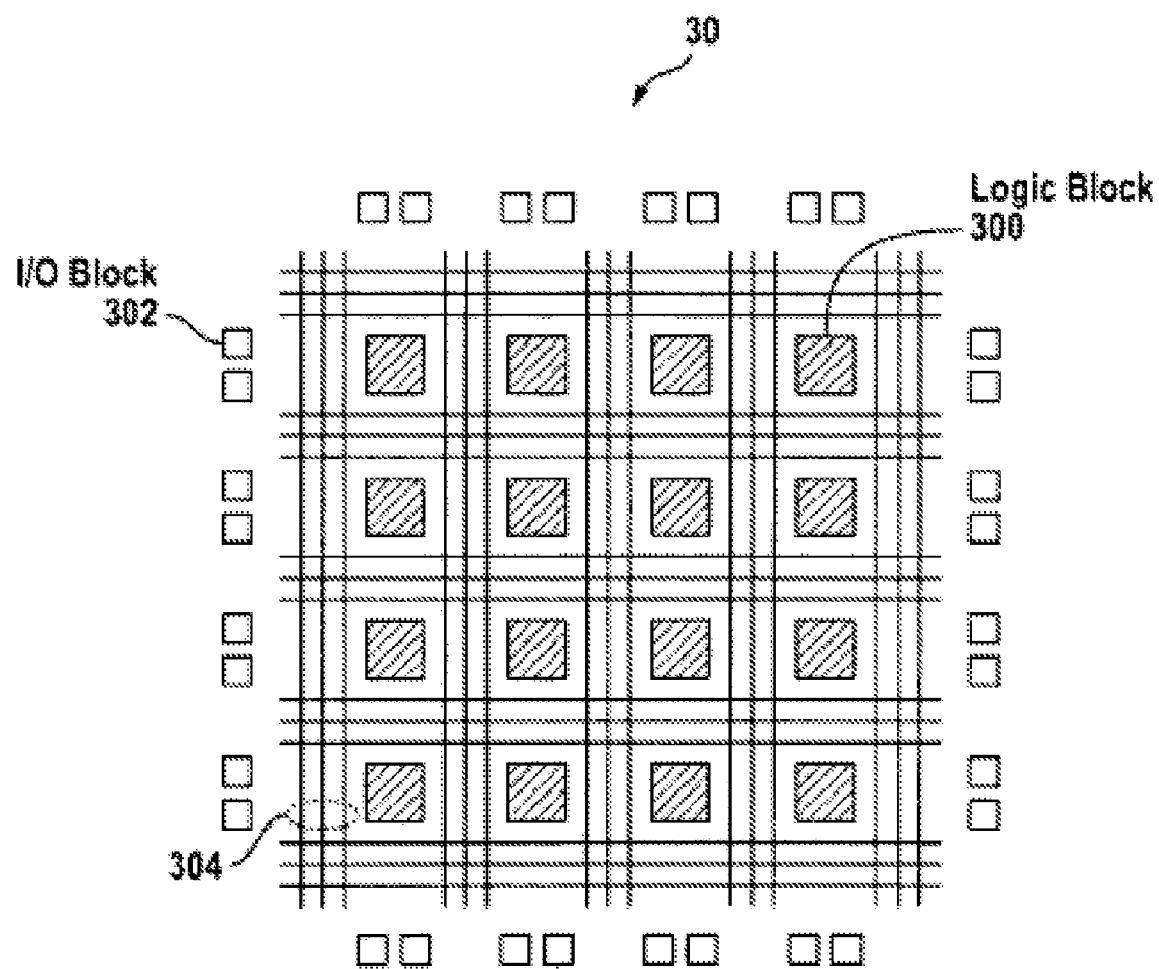
FIG. 3 is an architectural diagram of a prior art field programmable gate array (FPGA)
Figure 5:
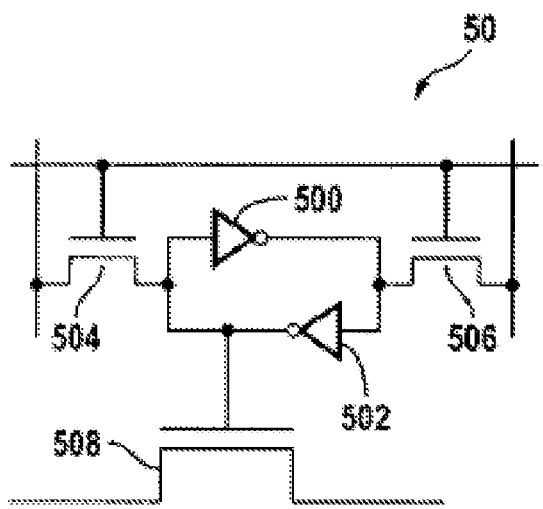
FIG. 5 is a circuit diagram of a prior art programmable switch using a convention six-transistor static random access memory (6T SRAM) cell.
Figure 6:
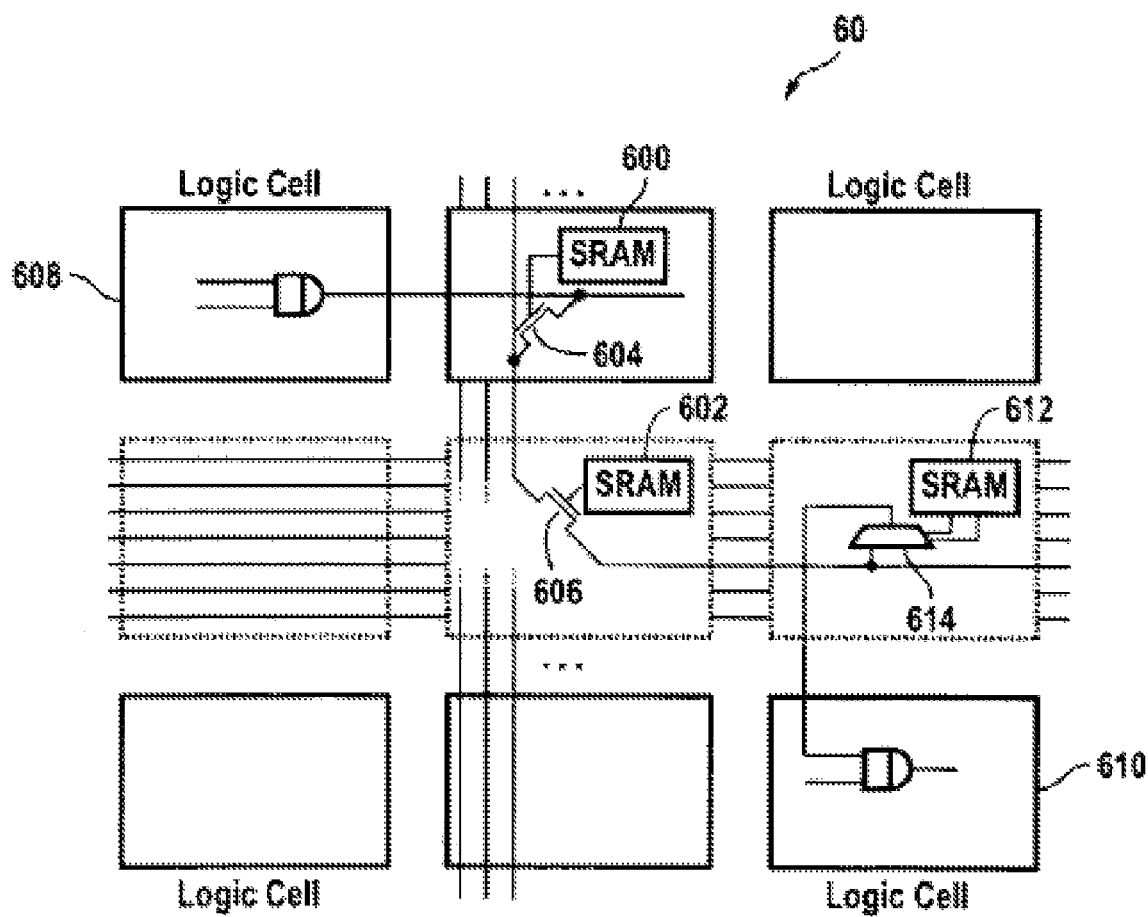
FIG. 6 is a simplified diagram of an FPGA, illustrating how SRAM-based configuration bits and a multiplexer are used to route a logic output of a first logic block of the FPGA to a logic input of a second logic block of the FPGA.
Figure 7:
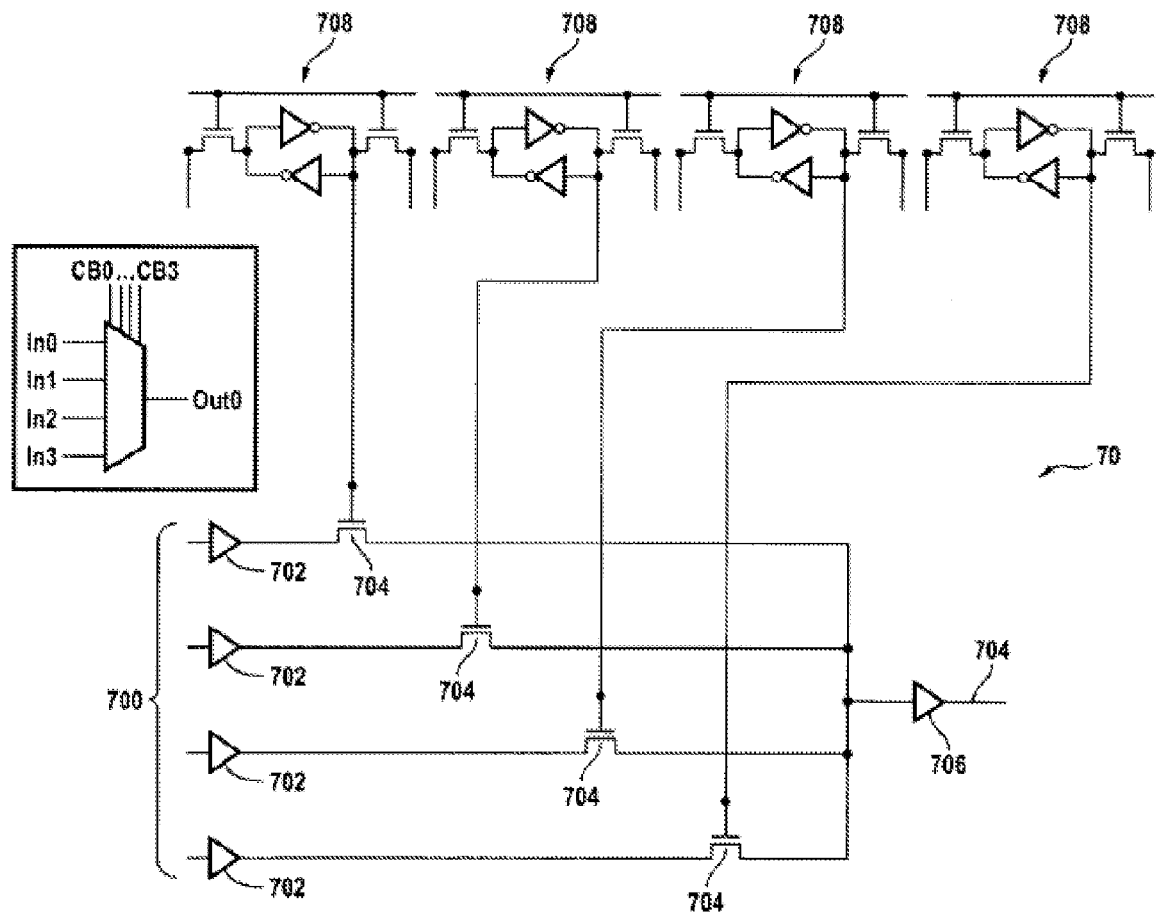
FIG. 7 is a schematic drawing of a prior art multiplexer controlled by SRAM cells.
Figure 8:
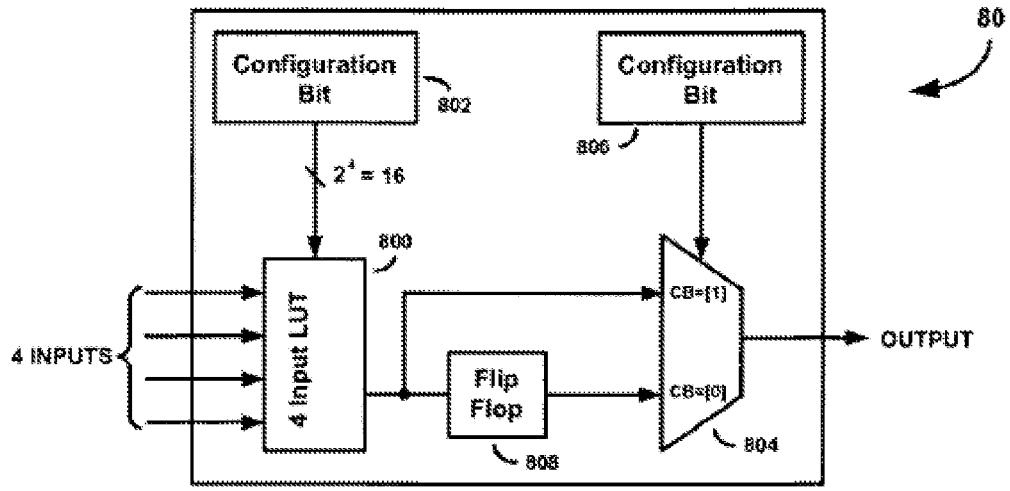
FIG. 8 is an architectural drawing of a typical logic block of a prior art FPGA, illustrating how a look-up table (LUT) is implemented with related FPGA components.
Figure 9:
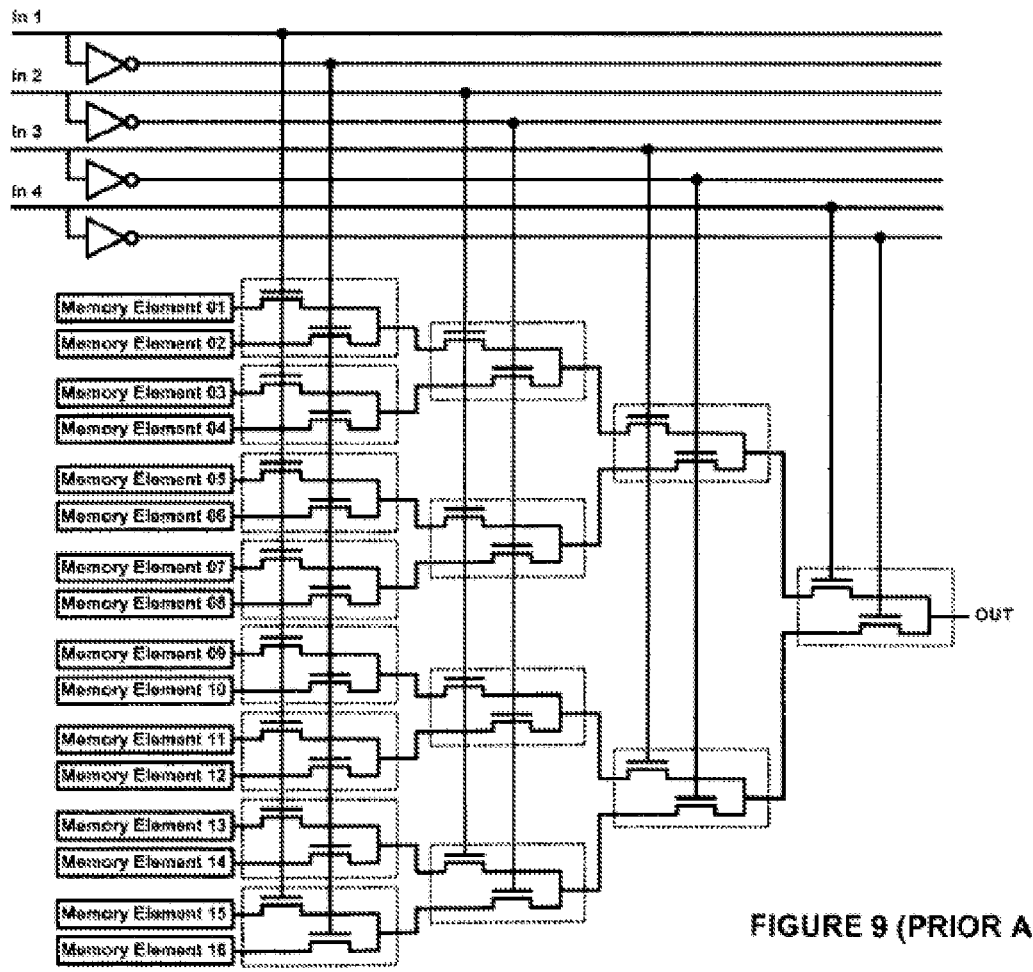
FIG. 9 is a schematic drawing of a prior art four-input LUT having SRAM-based memory cells.
Figure 10:
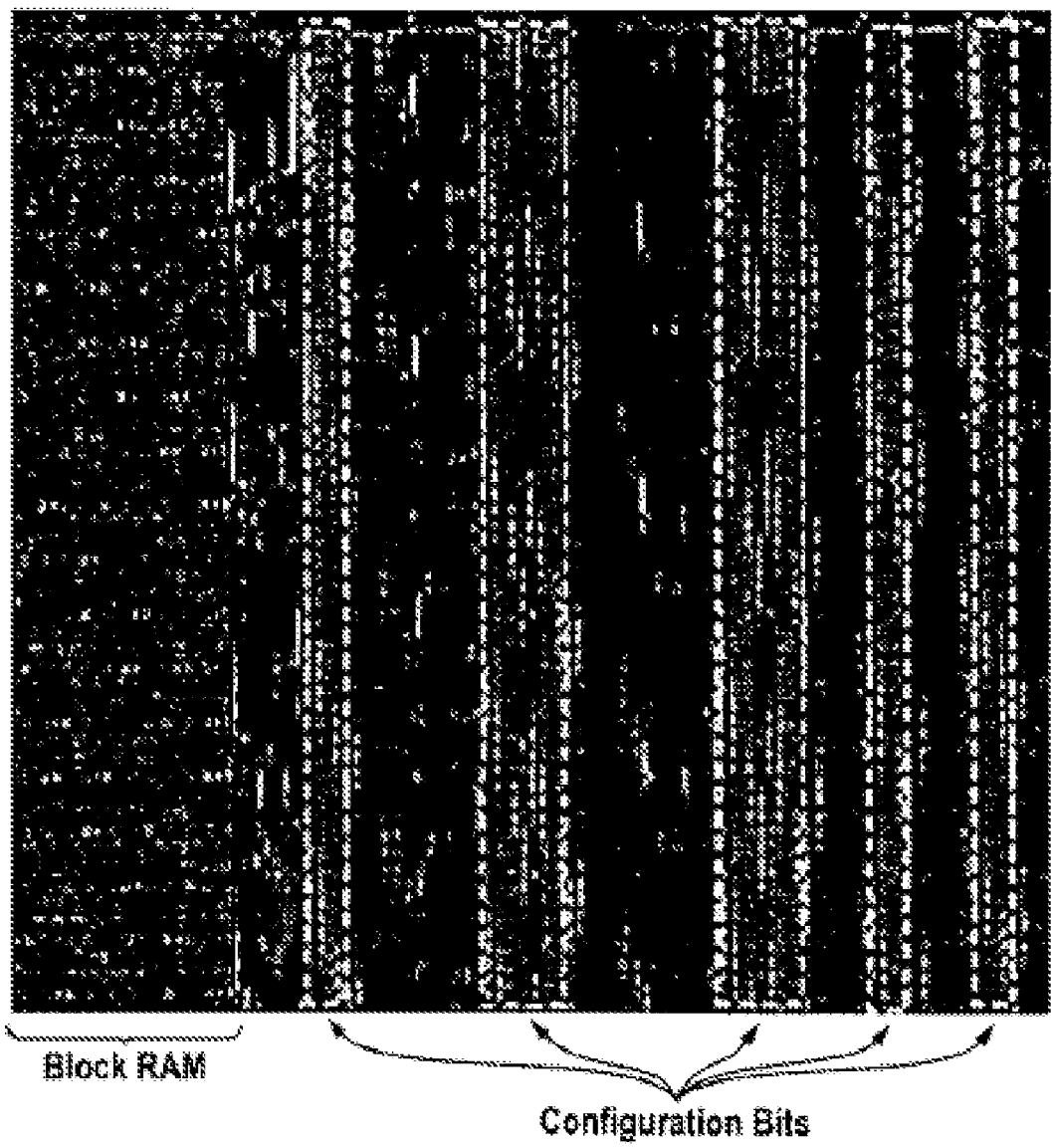
FIG. 10 shows the layout of a typical prior art SRAM-based FPGA, illustrating how the SRAM-based configuration bits consume a large area of the base silicon.

As described above in connection with FIG. 6, multiplexers are often used in programmable logic structures, such as FPGAs, to select and drive logic blocks. SRAM-based configuration bits are used to select the appropriate multiplexer(s) needed to transmit a logic output of a first logic block to an input of a second logic block in the FPGA. One or more additional SRAM-based configuration bits control the select lines of the appropriate multiplexers to complete the transmission of the logic output of the first logic block to the second logic block. A standard prior art 4:1 multiplexer using SRAM-based configuration bits was shown in FIG. 7 above. As explained above, SRAM-based cells have many drawbacks. Among other drawbacks, they are volatile, susceptible to radiation-induced errors, and occupy large amounts of silicon area.

Figure 18:
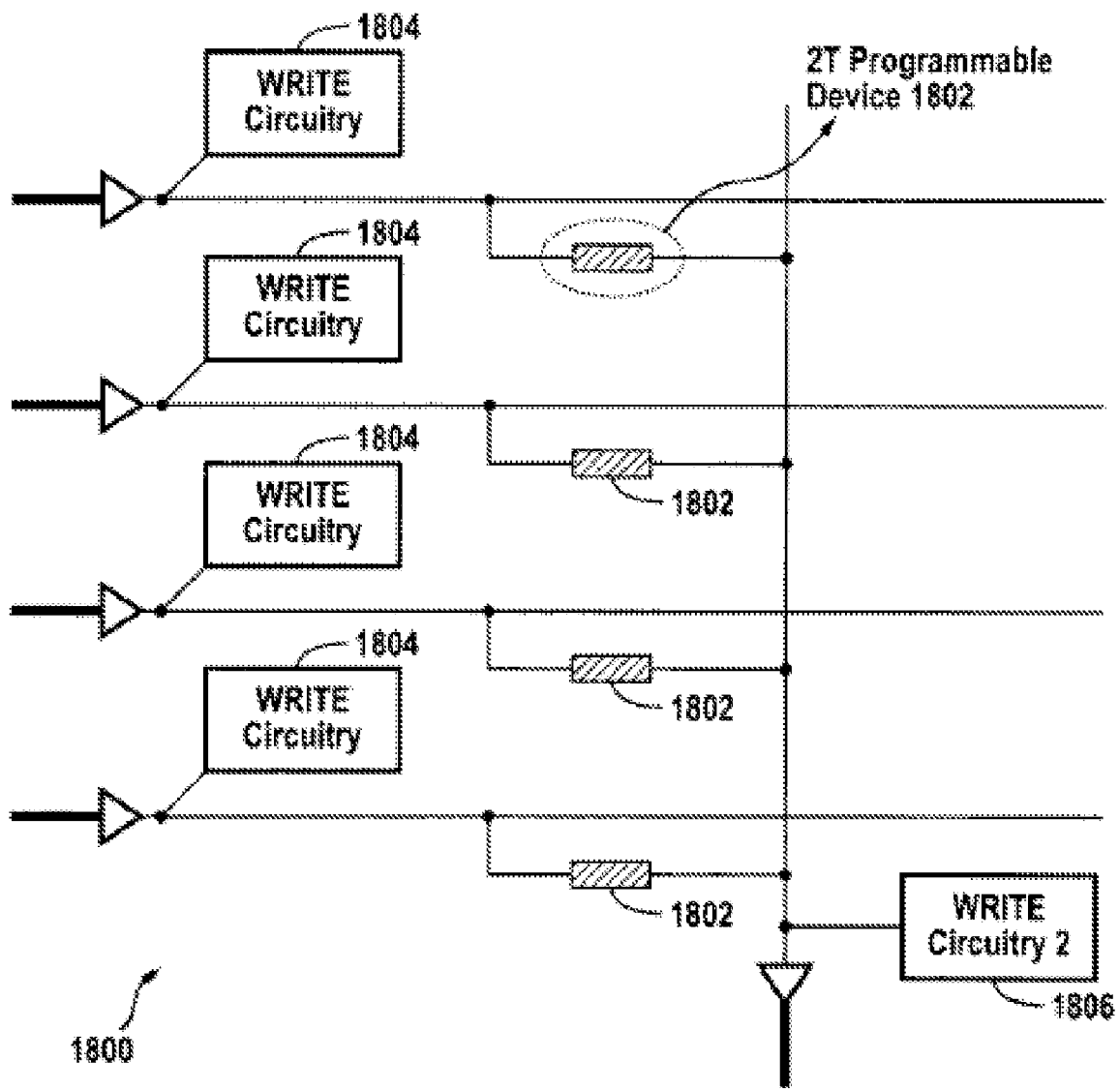
FIG. 18 is a schematic drawing of an exemplary 4:1 multiplexer containing two-terminal PCMDs, according to an embodiment of the present invention.

According to an embodiment of the present invention, PCMDs, such as those described above may be used in a 4:1 multiplexer. FIG. 18 shows a 4:1 multiplexer 1800 using two-terminal PCMDs. The PCMD-based 4:1 multiplexer comprises four two-terminal PCMDs 1802, each having first ends coupled to corresponding write circuits 1804 and second ends coupled to global write circuit 1806. Each of the PCMDs 1802 are similar to the two-terminal PCMD shown in FIG. 13. Which of the four inputs is selected to be transmitted to the output depends on which of the four PCMDs 1802 has been programmed to a low-resistance state. For example, if the top-most PCMD 1802 has been programmed to a low-resistance state, while the other three PCMDs have all been programmed to a high-resistance state, the top-most input is selected and routed to the multiplexer output. To program a given PCMD 1802 to a low resistance state, a programming pulse is applied by the corresponding write circuit 1804. (See FIGS. 11 and 12 and accompanying description above.) After sufficient joule heating has been applied to the PCM, the programming pulse is ramped down slowly so that the PCM of the given PCMD 1802 solidifies to a crystalline, low-resistance state.

Figure 19:
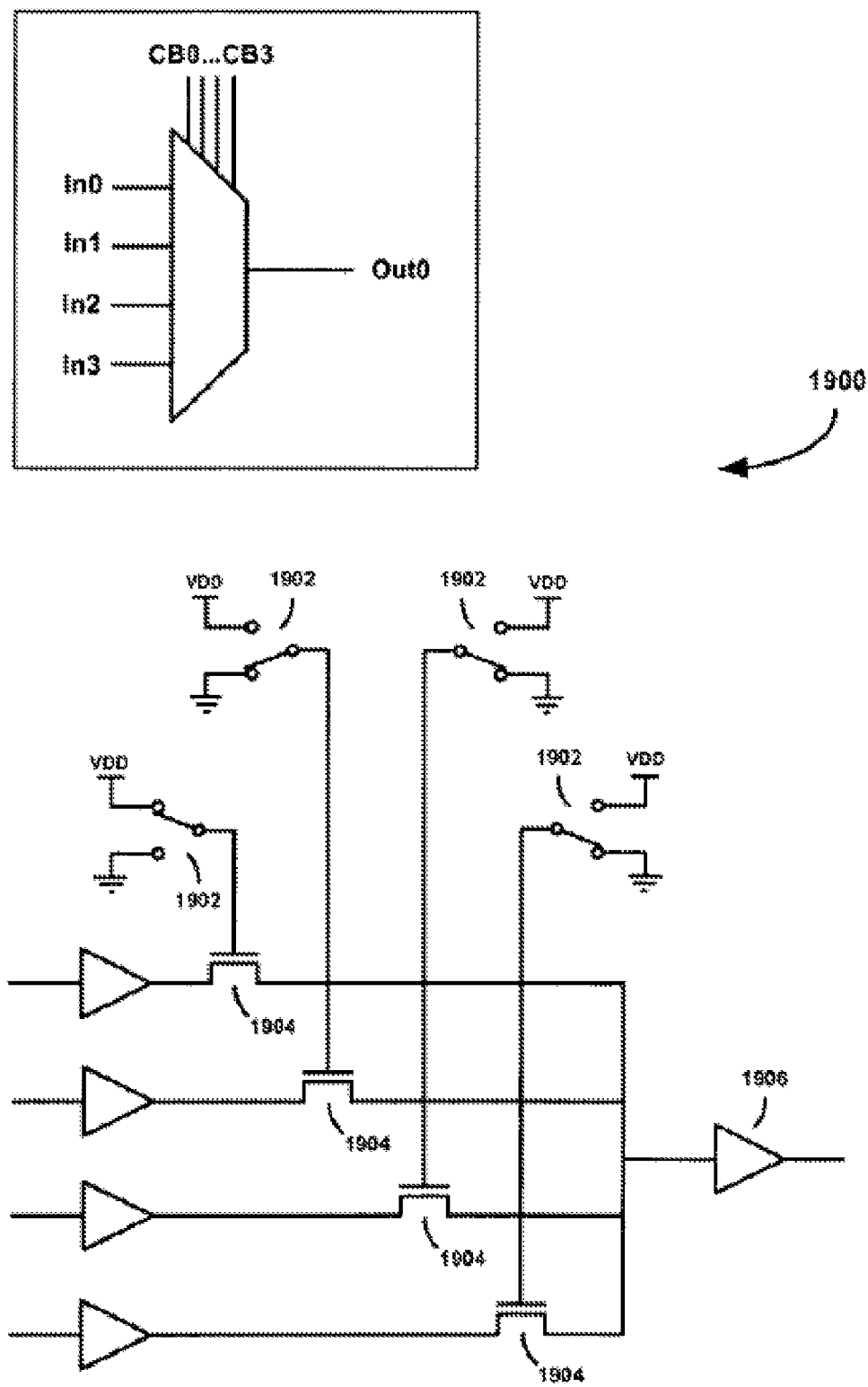
FIG. 19 is a schematic drawing of an alternative exemplary 4:1 multiplexer containing PCMDs that control passgates, according to an embodiment of the present invention.

FIG. 19 shows an alternative multiplexer 1900 formed from PCMD-based memory elements that control corresponding passgates. The PCMD-based memory elements are shown as switches 1902, which may be programmed to a logic "1" state (low-resistance) or a logic "0" (high-resistance) state. The PCMDs control the opening and closing of MOS passgates 1904. Which of the four inputs, In0, In1, In2 or In3 is routed to the multiplexer output 1906 depends on the logic values to which the PCMDs 1902 have been programmed. For example, if the PCMD 1902 furthest to the left in FIG. 19 has been programmed to a logic "1" condition, and the remaining PCMDs 1902 have been programmed to logic "0" conditions, the top-most input of the multiplexer 1900 is routed to the multiplexer output 1906. Compared to the multiplexer 1800 in FIG. 18, the multiplexer 1900 in FIG. 19 has the added benefit of a low Ron in the paths between the multiplexer inputs and outputs.

Figure 20:
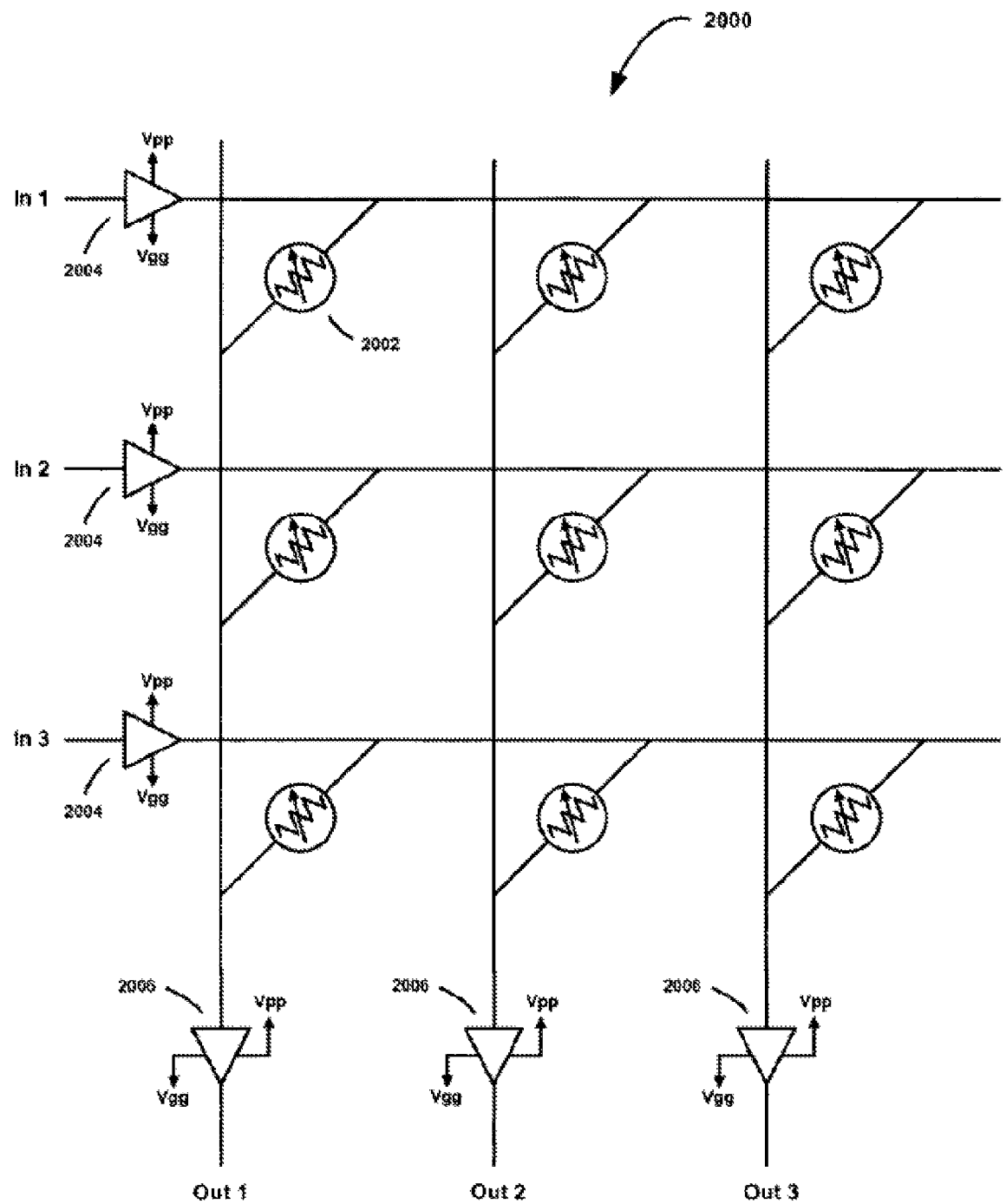
FIG. 20 is a schematic drawing of a 3.times.3 crossbar containing PCMDs, according to an embodiment of the present invention.

Another type of structure that is commonly found in programmable logic structures, such as FPGAs, is the crossbar. A crossbar may be thought of as being superset of a multiplexer. Conceptually, the crossbar is an M.times.N switch (M and N are positive integers greater than or equal to 1) where any one of M inputs can be routed to any one of N outputs. FIG. 20 is a schematic diagram of a 3.times.3 crossbar 2000 using PCMD-based switches, according to an embodiment of the present invention. The 3.times.3 PCMD-based crossbar includes three horizontal conducting lines and three vertical conducting lines. Two-terminal PCMDs 2002 are coupled between each of the horizontal conducting lines and each of the vertical conducting lines. Input signals In1, In2, In3 are applied to inputs of drivers 2004 and output signals Out1, Out2 and Out3 are provided by receivers 2006. An input is connected to an output by programming the PCMD connected between the two conducting wires to a low-resistance state. The necessary programming voltages and timing pulses needed to program the PCMDs may be applied by separate programming circuitry (not shown in FIG. 20). In an alternative implementation, the drivers 2004 at the inputs of the crossbar 2000 and the receivers 2006 at outputs of the crossbar 2000 may be used to program the PCMDs 2002.

Figure 21:
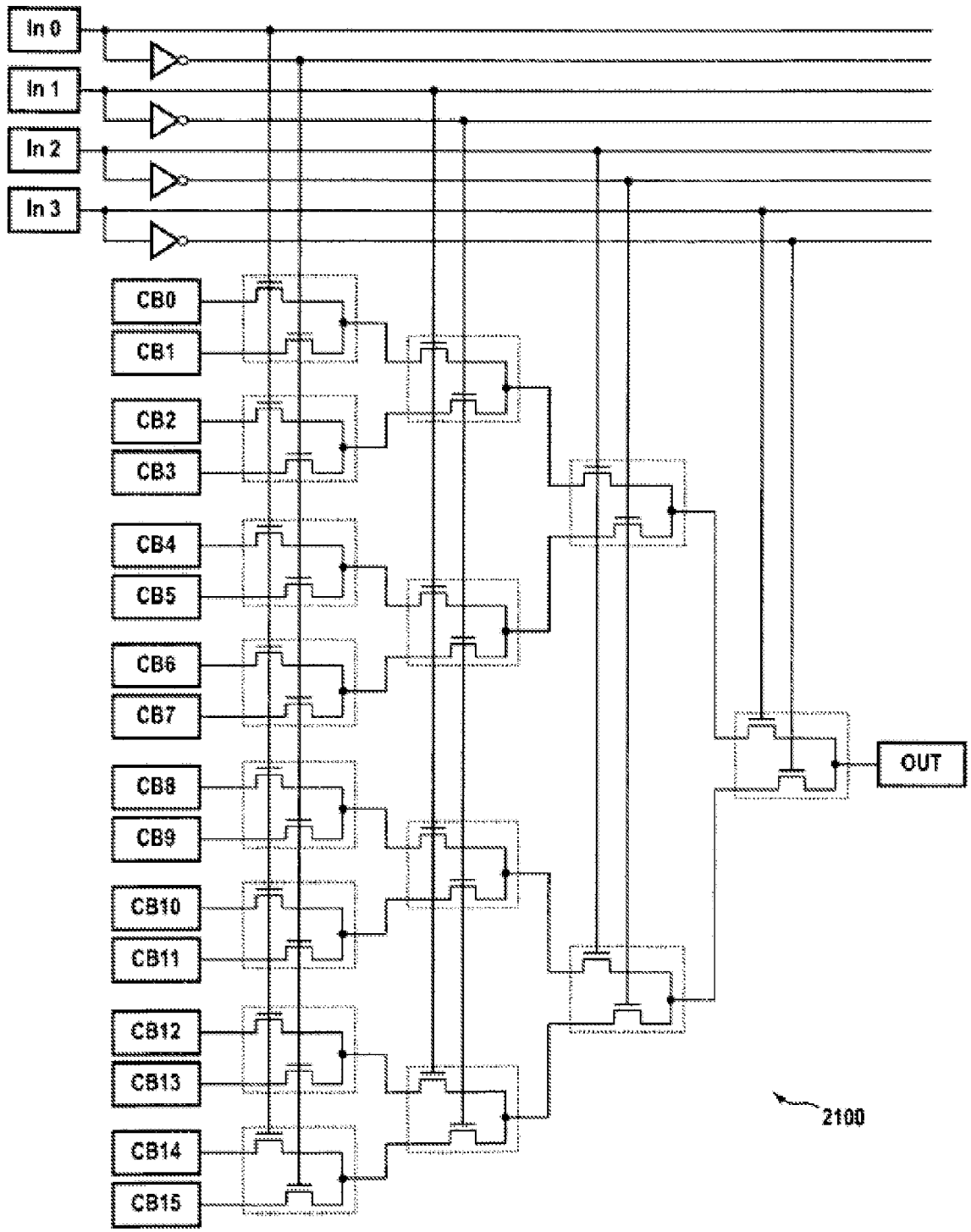
FIG. 21 is a schematic drawing of a four-input look-up table (LUT) having PCM-based configuration bits, according to an embodiment of the present invention.

Referring now to FIG. 21, there is shown a four-input LUT 2100 having four inputs, In0, In1, In2 and In3, and $2^4$ possible output choices. The LUT 2100 comprises a plurality of PCMD-based configuration bit elements (labels "CB0, CB1, . . . , CB15), an output and a chain of NMOS passgates coupled between the configuration bit elements and the output. The opening and closing of the passgates are controlled by inputs In0, In1, In2 and In3. The LUT 2100 provides a Boolean function that depends on the logic values stored on the PCMD-based configuration bits and the logic input values of inputs In0, In1, In2 and In3. The PCMD-based configuration bits may be implemented in various ways, including similar to the configuration bit structures shown in FIGS. 14, 15 and 17A above.

Figure 22A:
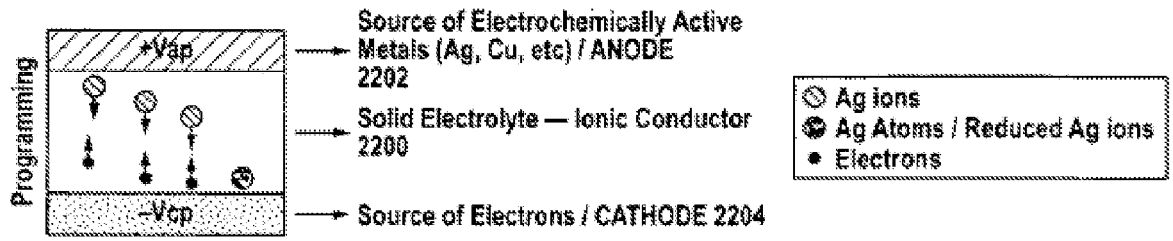
FIGS. 22A-D are cross-sectional drawings of a programmable metallization device (PMD), illustrating the altering of the cell between low-resistance and high-resistance states.

As an alternative to using PCMDs in the configuration bit, multiplexer, crossbar and LUT circuits discussed above, programmable metallization devices (PMDs) may be used, in accordance with another embodiment of the present invention. As shown in FIG. 22A, the PMD comprises a solid electrolyte material 2200 such as, for example, silver selenide ($Ag_2Se$), which is formed between an electrochemically active metal anode 2202 (e.g. Ag, Cu, etc.) and a cathode 2204, which may be any electrically conducting material, e.g. a metal, that operates as a source of electrons. Further details describing the operation and construction of a PMD are described in M. Kozicki et al., "Nanoscale Memory Elements Based on Solid State Electrolyte, "IEEE Transactions on Nanotechnology, vol. 4, no. 3, May 2005, which is incorporated into the present disclosure by reference, but only to the extent it does not conflict with the present disclosure.

Figure 22B:
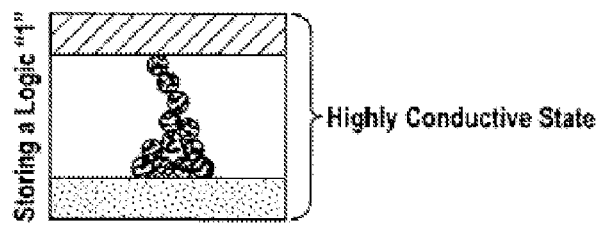

The PMD may be programmed to a non-volatile state and may be erased and programmed over and over again. To program the PMD (i.e. to store a logic "1" on the device), a voltage ($V_{anode} > V_{cathode}$) is applied across the anode 2202 and electrode 2204. As shown in FIG. 22A, the applied bias causes electrons from the cathode 2204 and $Ag^+$ ions from the anode 2202 to be injected into the electrolyte 2200, where they are reduced ($M^+ + e^- \rightarrow M^0$) into Ag atoms. The reaction continues until a conductive chain of Ag atoms forms an electrically conducting path between the anode 2202 and the cathode 2204, as shown in FIG. 22B. The resulting configuration of the programming process is a non-volatile state, i.e., the conductive chain will remain after the programming voltage is removed from the device.

Figure 22C:
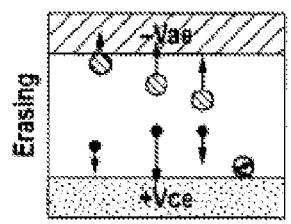
Figure 22D:
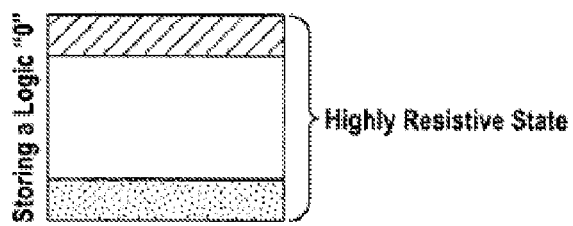

To erase the PMD (i.e. to store a logic "0") a voltage having a polarity opposite that used to program the device is applied across the anode 2202 and cathode 2204. The applied voltage causes Ag atoms in the electrolyte 2200 to ionize. As illustrated in FIG. 22C, the ionization process creates $Ag^+$ ions and electrons, which are attracted to and collected by the anode 2202 and cathode 2204, respectively. The erasing process is continued until the electrolyte 2200 reaches a sufficiently high resistive state to properly represent a logic "0".

According to an embodiment of the present invention, the PMD in FIG. 22 are used to form configuration elements for reconfigurable circuits. FIG. 23A shows an exemplary configuration bit 2300 using PMCs, according to an embodiment of the present invention. The PMD-based configuration bit 2300 comprises a first PMD 2302, a second PMD 2304, a programming access transistor 2306, and a MOS pass gate (or an MOS pass gate tree) 2308. The first PMD 2302 has an anode that is coupled to a local VP supply rail and a cathode that is coupled to the gate of the MOS pass gate (or an MOS pass gate tree) 2308. The second PMD 2304 has an anode that is coupled to a global (shared) VN rail and a cathode that is coupled to the gate of the MOS pass gate (or an MOS pass gate tree) 2308. Note that because of the excellent $R_{off}/R_{on}$ characteristics of the PMDs, no leakage stop transistors are needed in the series paths of the PMDs, as, for example, may be needed in configuration bits formed from PCMDs (see FIG. 17A above). Note also that the PMD-based configuration bit may be formed in one or more metallization layers of the FPGA in which it is employed, thereby freeing up active silicon for logic functions. FIG. 23B is a table illustrating how the PMD-based configuration bit in FIG. 23A may be programmed to a logic "1" or a logic "0", what voltages are applied to inhibit programming, and a static mode of operation.

Figure 24:
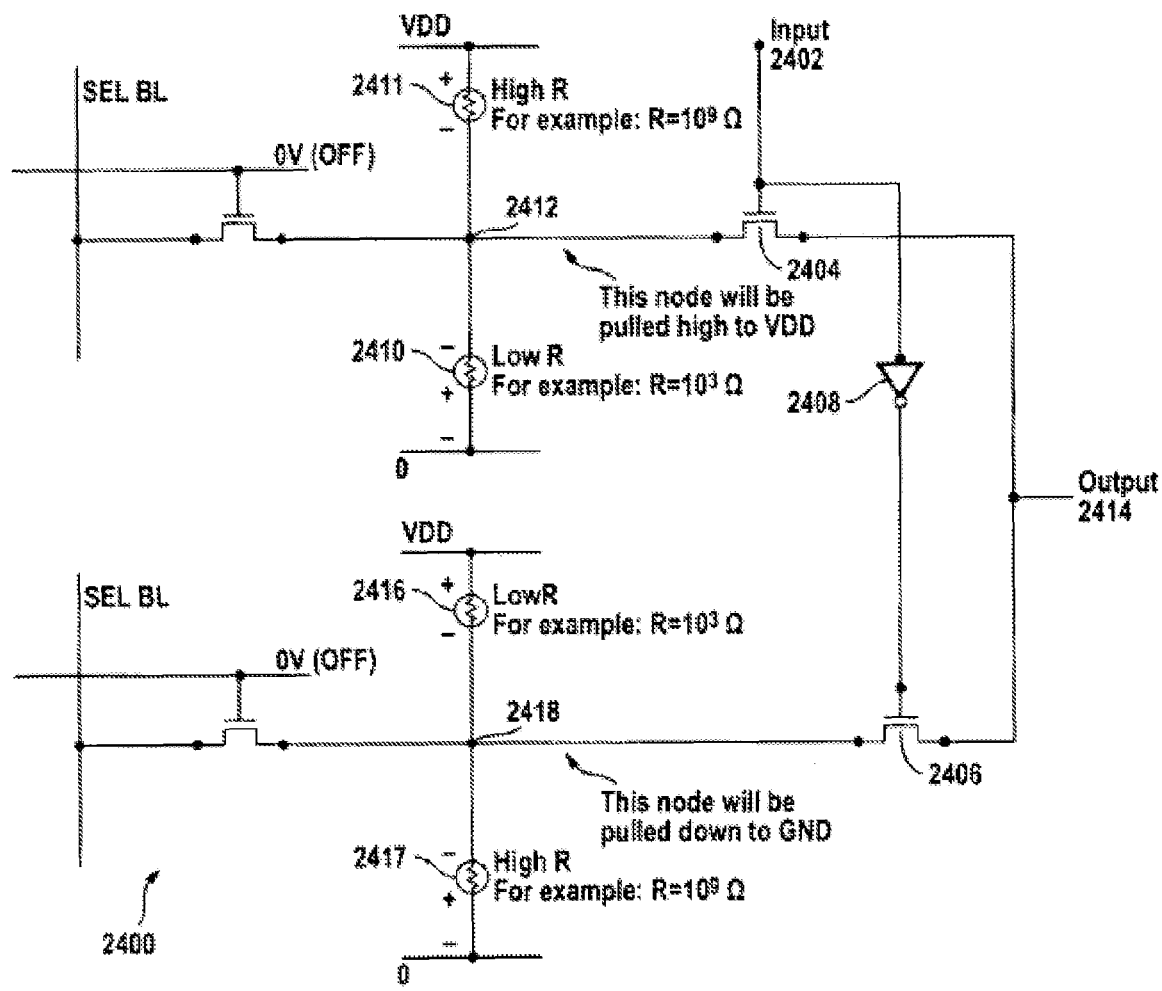
FIG. 24 is a schematic diagram of a simple one-input LUT having PMDs and configured to implement an logical inversion function, according to an exemplary embodiment of the present invention.

The PMDs and the PMD-based configuration bit may be used to implement various logic and control circuits needed in FPGAs, including multiplexers, crossbars and LUTs, similar to those described above for the PCMD-based circuits. FIG. 24 shows, for example, a schematic diagram of PMD-based configuration bits used in a simple one-input LUT 2400 having $2^1$ possible outputs. For illustration purposes, the configuration bits are configured to mimic a NOT logical operation (i.e. inversion). When a logic "1" is applied to the LUT input 2402, transistor 2404 is on and transistor 2406 is off, due to the inverter 2408. Because a first PMD 2410 has been programmed to a low resistance state, but a second PMD 2411 has been programmed to a high-resistance state, node 2412 is pulled to ground potential, and a logic "0" is passed through transistor 2404 to the output 2414. On the other hand, when a logic "0" is applied to the LUT input 2402, transistor 2404 is off and transistor 2406 is on. Because a third PMD 2416 has been programmed to a low resistance state, but a fourth PMD 2417 has been programmed to a high-resistance state, node 2418 is pulled to VDD, and a logic "1" is passed through transistor 2406 to the output 2414.

An alternative to using PCMDs or PMDs in the configuration bit, multiplexer, crossbar and LUT circuits discussed above, carbon nanotube nano-electromechanical (CNT-NEM) devices or metal NEM devices may be used, in accordance with another embodiment of the present invention. NEM devices are structures that use an electric field to cause a mechanical element to move. The mechanical element, if made of an electrically conducting material, can therefore be made to deflect in a manner that causes the element to either connect conducting terminals or disconnect conducting terminals. Such elements are used to form a reconfigurable structure (e.g. crossbar, LUT, multiplexer, or other logic function), which performs the functions of both a storage element and a switch, according to embodiments of the present invention. They have the characteristics of a standard relay, in that two or more terminals can be connected or disconnected by applying a voltage to another terminal or another set of terminals. They can also have the unique quality of retaining their position even after the programming bias has been removed, thereby making a non-volatile switch.

Figure 25A:
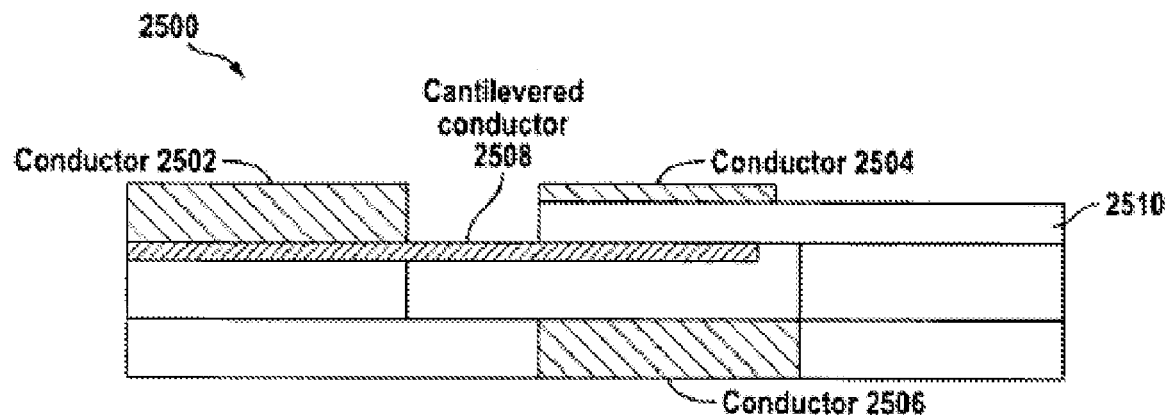
FIG. 25A is a cross-sectional drawing of a metal nano-electromechanical (NEM) switch configured in an open state.
Figure 25B:
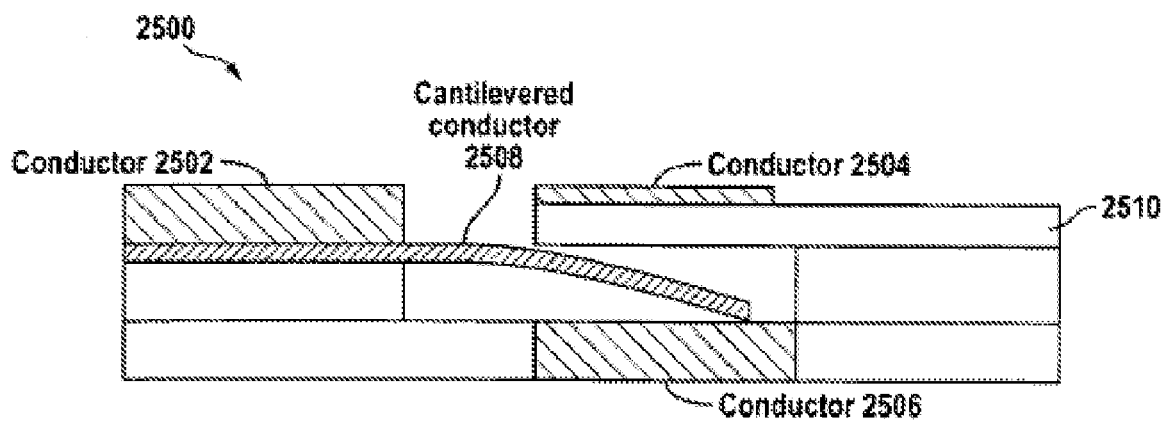
FIG. 25B is a cross-sectional drawing of a metal nano-electromechanical (NEM) switch programmed to a closed state.

FIGS. 25A and 25B show a metal NEM cantilever structure 2500, which is programmed in an open, high-resistance state (FIG. 25A) and a closed, low-resistance state (FIG. 25B). The metal NEM 2500 can be used to implement various devices (e.g. configuration bit, crossbar, LUT, multiplexer, etc.) in an FPGA or other programmable structure, according to embodiments of the present invention. The metal NEM device comprises first, second and third electrical terminals 2502, 2504 and 2506 and a cantilevered conductor (e.g. metal or carbon nanotube) 2508 disposed in free space between an insulating layer 2510 and the third terminals 2506. A positive voltage applied between the third terminal 2506 relative to the first terminal 2502 causes the cantilevered conductor 2508 to pull down so that it comes in contact with the third terminal 2506, thereby closing the circuit between the first and third terminals 2502, 2506. To open the connection, a positive voltage is applied between the second terminal 2504 and the third terminal 2506. The electric field generated within the insulating layer 2510 pulls the cantilevered conductor 2508 away and off of the third terminal 2506, thereby opening the switch.

Figure 26A:
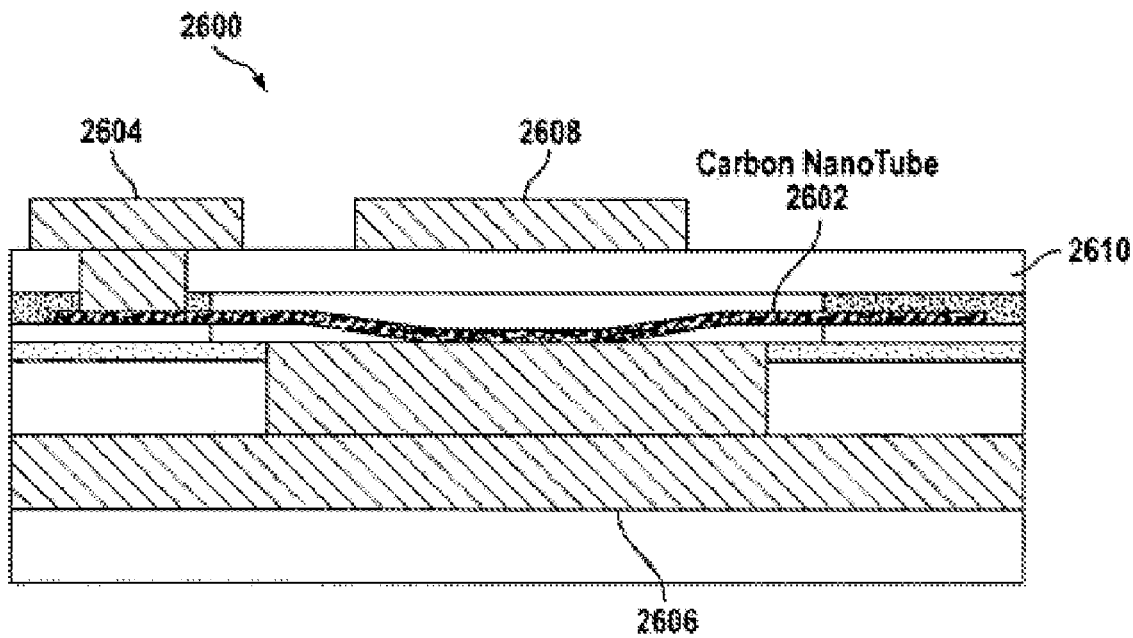
FIG. 26A is a cross-sectional drawing of a carbon nanotube electromechanical (CNT-NEM) switch programmed to a closed state.
Figure 26B:
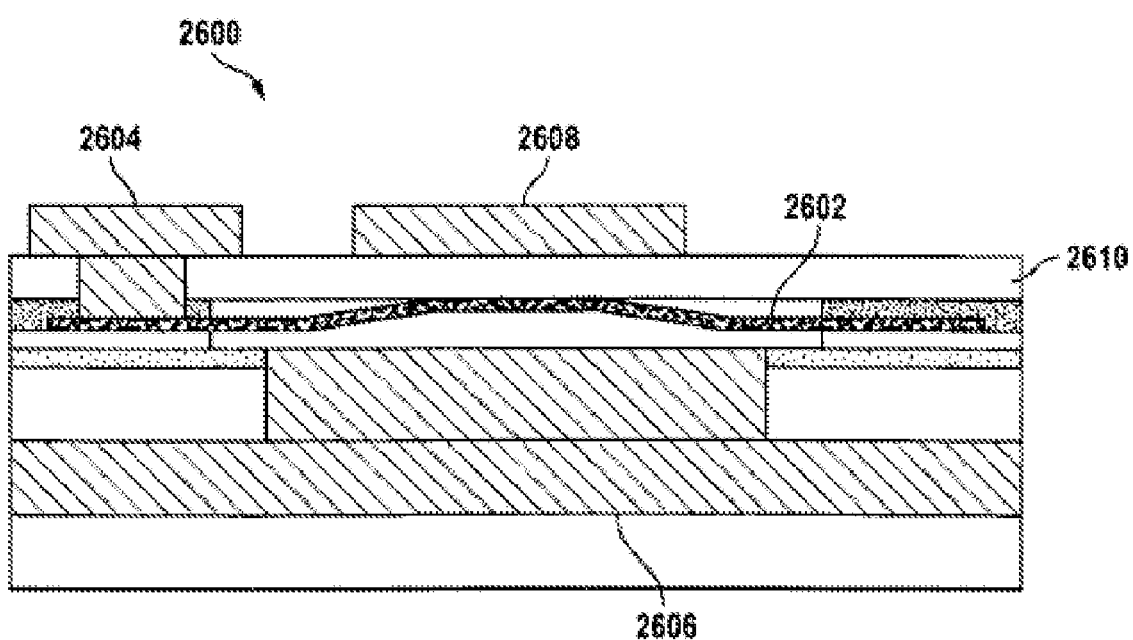
FIG. 26B is a cross-sectional drawing of a CNT-NEM switch programmed to an open state.

FIGS. 26A and 26B show a CNT-NEM device 2600, which is programmed in a closed, low-resistance state (FIG. 26A) and an open, high-resistance state (FIG. 26B). The CNT-NEM device 2600 can be used to implement various circuits (e.g. configuration bit, crossbar, LUT, multiplexer, etc.) in an FPGA or other programmable structure, according to an embodiment of the present invention. The CNT-NEM device 2600 utilizes one or more carbon nanotubes 2602 as a switching structure that can be controlled by electric fields applied to the device. A CNT has the properties of very good strength and elasticity. Under very large angles of deflection the CNT will retain it shape and tension thus allowing it to easily return to its initial state with causing fatigue.

As shown in FIGS. 26A and 26B, the CNT-NEM device 2600 has two basic states: a closed state, and open state. The closed state occurs when electrical nodes 2604 and 2606 are electrically connected via one or more CNTs 2602, thereby creating a substantially low resistance path. FIG. 26A shows the CNT-NEM device in a closed state. To create the closed state, a positive voltage is applied between electrically conducting nodes 2606 and 2604 to create an electrostatic force sufficient enough to overcome the inherent tension of the CNT film 2602 and to potentially overcome other attractive forces due to the CNT contact with other materials that are part of the CNT structure. FIG. 26B shows the CNT-NEM device 2600 in an open state. To create an open state, a positive voltage is applied between a third electrically conducting node 2608 to create an electric field in a dielectric layer 2610. When the electrostatic force is great enough to overcome the Van der Waals forces between the CNT film 2602 and conducting node 2606, the CNT film 2602 deflects toward node 2608, thereby opening the switch.

Figures 27, 28:
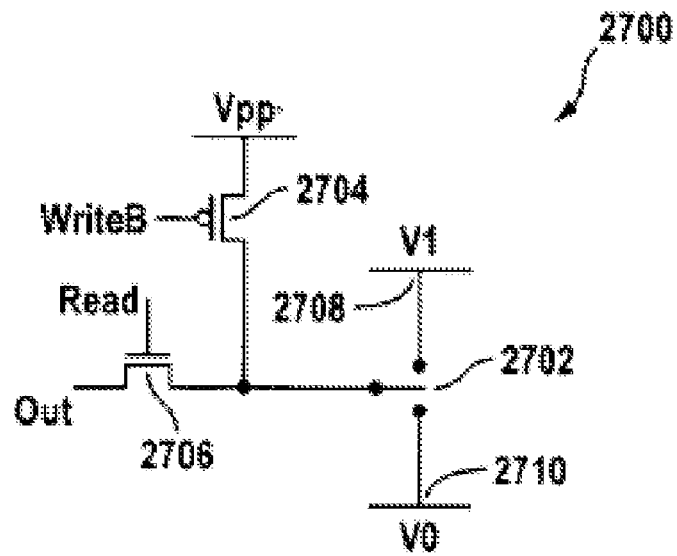
FIG. 27 is a schematic drawing of a configuration bit using a three-terminal CNT-NEM (or, alternatively, a three-terminal metal NEM), according to an embodiment of the present invention.
FIG. 28 is a table listing exemplary voltages applied to the three-terminal configuration bit in FIG. 27 to program and read the configuration bit.

FIG. 27 is a schematic drawing of a configuration bit 2700 using a three-terminal CNT-NEM 2702, similar to that shown in FIGS. 26A and 26B above, according to an embodiment of the present invention. The configuration bit 2700 comprises a three-terminal CNT-NEM device 2702 (shown as a controlled switch), a write transistor 2704, and a read transistor 2706.

FIG. 28 is a table listing exemplary voltages that are applied to the configuration bit 2700 in order to: write a logic "1", write a logic "0", read the configuration bit 2700 after being programmed to a logic "1", and read the configuration bit after being programmed to a logic "0". To write (i.e. program) a logic "1" into the configuration bit 2700, the WriteB and Read inputs are pulled to 0V, the programming voltage Vpp is set to 2.5V, a first CNT-NEM switch terminal 2708 is set to V1=0 V, and a second CNT-NEM switch terminal 2710 and OUT terminals are left floating (i.e., are not connected (NC)). Under these bias conditions, an electric field is generated between the carbon nanotube and the first CNT-NEM switch terminal 2708. The electric field causes the carbon nanotube to deflect towards the first CNT-NEM switch terminal 2708 and close an electrical connection between the two. The procedure used to program a logic "0" into the configuration bit 2700 is similar to that for programming a logic "1", except that the voltage levels applied to the first and second CNT-NEM switch terminals 2708 and 2710 are reversed.

To read the configuration bit 2700 after a logic "1" has been written, a high voltage (e.g. 1.2 V) is applied to the gate of the write transistor 2704, thereby turning it off, the programming voltage Vpp is set to a low voltage (e.g. Vpp=0 V) to reduce power consumption during the read operation, a high voltage (e.g. 1.2 V) is applied to the first CNT-NEM switch terminal 2708, and a low voltage (e.g. 0 V) is applied to the second CNT-NEM switch terminal 2710. A high voltage (e.g. 1.2 V) is also applied to the gate of the NMOS read transistor 2706. Under these bias conditions, because the carbon nanotube is coupled to V1=1.2 V, the output of the read transistor is 1.2V minus a threshold drop of the read transistor 2706. Reading the configuration bit 2700 after a logic "0" has been written into the configuration bit 2700 is similar to reading a logic "1", the only difference being that the carbon nanotube is coupled to V0=0 V, during the read operation, which is a condition indicative of a stored logic "0".

Figures 29, 30:
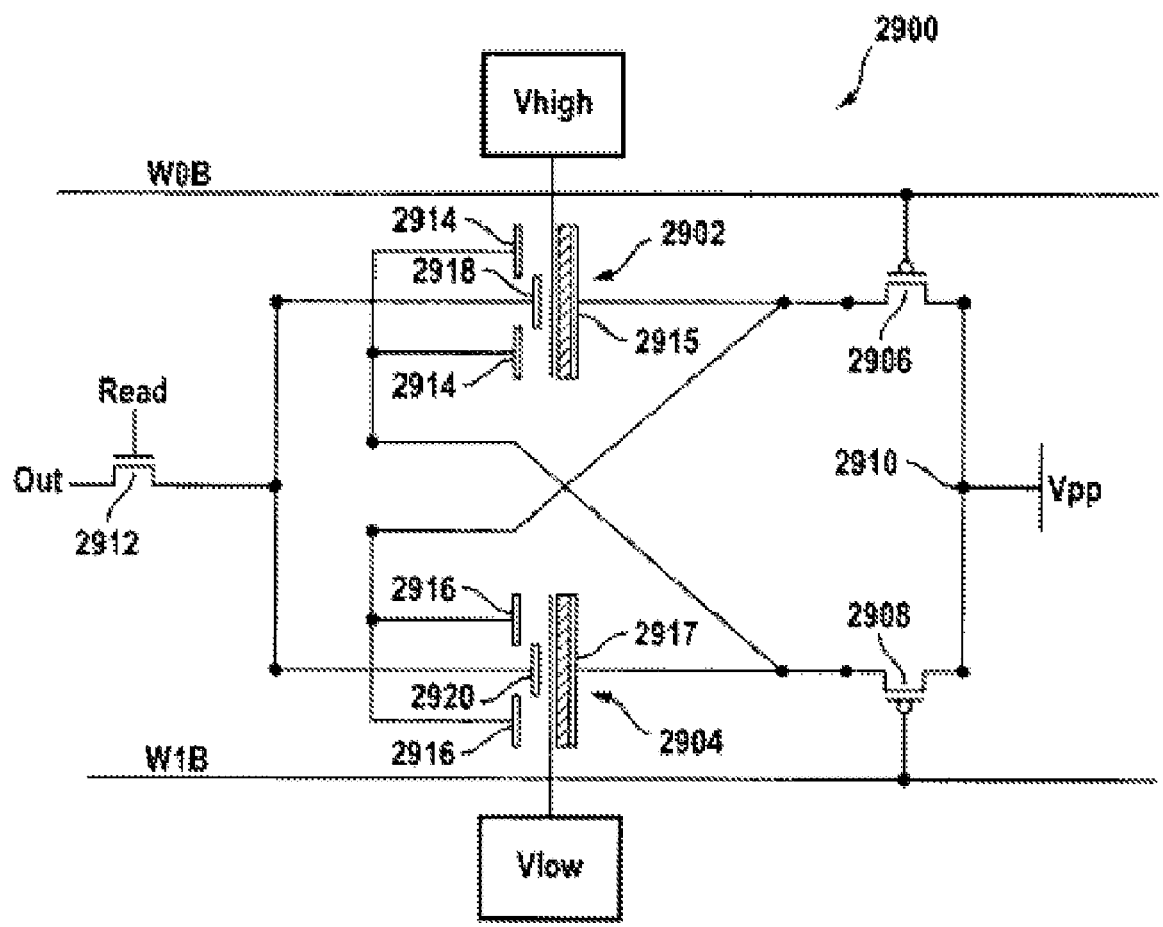
FIG. 29 is a schematic drawing of a configuration bit using a four-terminal CNT-NEM (or, alternatively, a four-terminal metal NEM), according to an embodiment of the present invention.
FIG. 30 is a table listing exemplary voltages applied to the four-terminal configuration bit in FIG. 29 to program and read the configuration bit.

Referring now to FIG. 29, there is shown a schematic drawing of a configuration bit 2900 using two four-terminal CNT-NEMs, according to an embodiment of the present invention. The configuration bit 2900 comprises first and second CNT-NEMs 2902 and 2904, first and second PMOS pass gate transistors 2906 and 2908, a programming voltage terminal 2910, and a read transistor 2912. The gate of the first PMOS pass gate transistor 2906 is coupled to a first write terminal W0B (the "B" stands for "bar") and the gate of the second PMOS pass gate transistor 2908 is coupled to a second write terminal W1B. The sources of the first and second PMOS pass gate transistors 2906, 2908 are coupled to the programming voltage terminal 2910. The drain of the first PMOS pass gate transistor 2906 is coupled to control terminals 2914 of the first CNT-NEM 2902, and the drain of the second PMOS pass gate transistor 2908 is coupled to control terminals 2916 of the second CNT-NEM 2904. The control terminals 2914 and 2916 of both the first and second CNT-NEMs 2902, 2904 are electrically insulated from the carbon nanotube of the CNT-NEMs 2902, 2904, by an insulting material disposed between the carbon nanotube of each device and the control terminals 2914 and 2916. The drains of the first and second PMOS pass gate transistor 2906, 2908 are also coupled to release gates 2915 and 2917 of the first and second CNT-NEMs 2902 and 2904, respectively. The drain of the read transistor 2912 is coupled to center terminals 2918 and 2920 of the first and second CNT-NEMs 2902, 2904, respectively.

FIG. 30 is a table listing exemplary voltages applied to the four-terminal configuration bit 2900 in FIG. 29 to program and read the configuration bit 2900 in FIG. 29. To write a logic "1" into the configuration bit 2900, a high voltage (e.g. 1.2 V) is applied to the W0B terminal, a low voltage (e.g. 0 V) is applied to the W1B terminal, and a programming voltage (e.g. 2.5 V) is applied to the programming voltage terminal 2910. The high voltage applied to the W0B terminal turns off the first PMOS pass gate transistor 2906, and the low voltage applied to the W1B terminal turns on the second PMOS pass gate transistor 2908. Because the second PMOS pass gate transistor 2908 is on, the programming voltage Vpp applied to the programming voltage terminal 2910 passes through the second PMOS pass gate transistor 2908 and is applied to the control gates 2914 of the first CNT-NEM 2902. The programming voltage applied to the control terminals 2914 creates an electric field in the insulator between the carbon nanotube and control terminals 2914 of the first CNT-NEM 2902, thereby causing the carbon nanotube to deflect, i.e. track toward, the center terminal 2918 until the carbon nanotube is in electrical contact with the center terminal 2918. The programming voltage passing through the second PMOS pass gate transistor 2908 is also applied to the release gate 2917 of the second CNT-NEM 2904, thereby creating an electric field between the release gate 2917 and the center terminal 2920 of the second CNT-NEM 2904. The electric field creates an electrostatic force that attracts the carbon nanotube of the second CNT-NEM 2904 toward the release gate 2917. The electrostatic force is of sufficient strength to overcome the combined Van der Waals force holding the carbon nanotube to the center terminal 2920 and the tension forces of the carbon nanotube itself, so that the carbon nanotube is released and deflected away from the center terminal 2920. Writing of the logic "1" into the configuration bit 2900 is now complete.

To read the configuration bit 2900 after a logic "1" has been written into the configuration bit 2900, a high voltage (e.g. 1.2 V) is applied to the gate of the read transistor 2912, a high voltage (e.g. 1.2 V) is applied to the carbon nanotube of the first CNT-NEM 2902, and a low voltage (e.g. 0 V) is applied to the carbon nanotube of the second CNT-NEM 2904. At the same time, a high voltage (e.g. 1.2 V) is applied to the gates of both the first and second PMOS pass gate transistors 2906 and 2908, thereby maintaining both the first and second PMOS pass gate transistors 2906 and 2908 in an off condition during the read operation. The high voltage applied to the gate of the read transistor 2912 causes the read transistor to turn on. Because the carbon nanotube of the first CNT-NEM 2902 is electrically coupled to the center terminal 2918, and a high voltage (e.g. 1.2 V) is applied to the carbon nanotube of the first CNT-NEM 2902, the read transistor 2912 properly reads out a logic "1".

To write a logic "0" into the configuration bit 2900, a low voltage (e.g. 0 V) is applied to the W0B terminal, a high voltage (e.g. 1.2 V) is applied to the W1B terminal, and a programming voltage (e.g. 2.5 V) is applied to the programming voltage terminal 2910. The low voltage applied to the W0B terminal causes the first PMOS pass gate transistor 2906 to turn on, and the high voltage applied to W1B terminal causes the second PMOS pass gate transistor 2908 to turn off. Because the first PMOS pass gate transistor 2906 is on, the programming voltage Vpp applied to the programming voltage terminal 2910 passes through the first PMOS pass gate transistor 2906 and is applied to the control gates 2916 of the second CNT-NEM 2904. The programming voltage applied to the control terminals 2916 creates an electric field in the insulator between the carbon nanotube and control terminals 2914 of the second CNT-NEM 2904, thereby causing the carbon nanotube to deflect, i.e. track toward, the center terminal 2920 until the carbon nanotube is in electrical contact with the center terminal 2920. The programming voltage passing through the first PMOS pass gate transistor 2906 is also applied to the release gate 2915 of the first CNT-NEM 2902, thereby creating an electric field between the release gate 2915 and the center terminal 2918 of the first CNT-NEM 2902. The electric field creates an electrostatic force that attracts the carbon nanotube of the first CNT-NEM 2902 toward the release gate 2915. The electrostatic force is of sufficient strength to overcome the combined Van der Waals force holding the carbon nanotube to the center terminal 2918 and the tension forces of the carbon nanotube itself, so that the carbon nanotube is released and deflected away from the center terminal 2918. Writing of the logic "0" into the configuration bit 2900 is now complete.

To read the configuration bit 2900 after a logic "0" has been written into the configuration bit 2900, a high voltage (e.g. 1.2 V) is applied to the gate of the read transistor 2912, a high voltage (e.g. 1.2 V) is applied to the carbon nanotube of the first CNT-NEM 2902, and a low voltage (e.g. 0 V) is applied to the carbon nanotube of the second CNT-NEM 2904. At the same time, a high voltage (e.g. 1.2 V) is applied to the gates of both the first and second PMOS pass gate transistors 2906 and 2908, thereby maintaining both the first and second PMOS pass gate transistors 2906 and 2908 in an off condition during the read operation. The high voltage applied to the gate of the read transistor 2912 causes the read transistor to turn on. Because the carbon nanotube of the second CNT-NEM 2904 is electrically coupled to the center terminal 2920, and a low voltage (e.g. 0 V) is applied to the carbon nanotube of the second CNT-NEM 2904, the read transistor 2912 properly reads out a logic "0".

While the configuration bits 2700 and 2900 above have been described as utilizing CNT-NEMs, in alternative embodiments metal electromechanical switches may be used instead of the carbon nanotube based switches. The operation (i.e. reading and writing) of such alternative configuration bits is substantially similar to that described above for the embodiments using CNT-NEM devices, as will readily be appreciated by those of ordinary skill in the art.

While particular embodiments of the present invention have been shown and described, it will be obvious to those skilled in the art that, based upon the teachings herein, changes and modifications may be made without departing from this invention and its broader aspects. Accordingly, the appended claims are intended to encompass within their scope all such changes and modifications as are within the true spirit and scope of the described inventions.

What is claimed is:

1. An integrated circuit ("IC"), comprising:
    a configurable logic block capable of performing a logic function; and
    a programmable interconnect element coupled to said configurable logic block, said programmable interconnect element configured to have a multiplexer capable of facilitating to configure said configurable logic block, wherein said multiplexer includes:
    a plurality of inputs;
    an output; and
    a plurality of input-output path selection devices coupled between the plurality of inputs and the output, at least one input-output path selection device of the plurality of input-output path selection devices comprising a phase change material device coupled to a control terminal of said multiplexer.

2. The IC of claim 1 wherein the phase change material device of said at least one input-output path selection device is disposed directly within an input-output path of the multiplexer.

3. The IC of claim 1 wherein said at least one input-output path selection device further comprises an active device coupled to the phase change material device, said active device disposed within an input-output path of the multiplexer.

4. The IC of claim 3 wherein said active device comprises a transistor.

5. The IC of claim 3 wherein said active device comprises a phase change material device.

6. An integrated circuit ("IC"), comprising:
    a configurable logic block capable of performing a logic function; and
    a programmable interconnect element coupled to said configurable logic block, said programmable interconnect element configured to have a multiplexer capable of facilitating to configure said configurable logic block, wherein said multiplexer includes:
a plurality of inputs;
an output; and
a plurality of input-output path selection devices coupled between the plurality of inputs and the output, at least one input-output path selection device of the plurality of input-output path selection devices comprising a programmable metallization device coupled to a control terminal of said multiplexer.

7. The IC of claim 6 wherein the programmable metallization device of said at least one input-output path selection device is disposed directly within an input-output path of the multiplexer.

8. The IC of claim 6 wherein said at least one input-output path selection device further comprises an active device coupled to programmable metallization device, said active device disposed within an input-output path of the multiplexer.

9. The IC of claim 8 wherein said active device comprises a transistor.

10. The IC of claim 8 wherein said active device comprises a programmable metallization device.

11. An integrated circuit ("IC"), comprising:
a configurable logic block capable of performing a logic function; and
a programmable interconnect element coupled to said configurable logic block, said programmable interconnect element configured to have a multiplexer capable of facilitating to configure said configurable logic block, wherein said multiplexer includes:
a plurality of inputs;
an output; and
a plurality of input-output path selection devices coupled between the plurality of inputs and the output, at least one input-output path selection device of the plurality of input-output path selection devices comprising a nano-electromechanical device coupled to a control terminal of said multiplexer.

12. The IC of claim 11 wherein the nano-electromechanical device of said at least one input-output path selection device is disposed directly within an input-output path of the multiplexer.

13. The IC of claim 11 wherein said at least one input-output path selection device further comprises an active device coupled to the nano-electromechanical device, said active device disposed within an input-output path of the multiplexer.

14. The IC of claim 13 wherein said active device comprises a transistor.

15. The IC of claim 13 wherein said active device comprises a nano-electromechanical device.

16. The IC of claim 11 wherein the nano-electromechanical device comprises a carbon nanotube nano-electromechanical device.

17. The IC of claim 11 wherein the nano-electromechanical device comprises a metal nano-electromechanical device.

18. An integrated circuit ("IC"), comprising:
a configurable logic block capable of performing a logic function; and
a programmable interconnect element coupled to said configurable logic block, said programmable interconnect element configured to have a multiplexer capable of facilitating to configure said configurable logic block, wherein said multiplexer includes:
a plurality of inputs;
an output; and
a plurality of input-output paths selectively coupled between said plurality of inputs and said output, each input-output path of said plurality of input-output paths including a two-terminal nonvolatile reconfigurable device coupled to a control terminal of said multiplexer,
wherein programmed resistance values of said two-terminal nonvolatile reconfigurable devices determine which of the inputs of said plurality of inputs is electrically coupled to said output.

19. The IC of claim 18 wherein said two-terminal nonvolatile reconfigurable devices comprise a plurality of phase change material devices.

20. The IC of claim 18 wherein said two-terminal nonvolatile reconfigurable devices comprise a plurality of programmable metallization cells.

21. The IC of claim 18 wherein said two-terminal nonvolatile reconfigurable devices comprise a plurality of nano-electromechanical devices.

22. An integrated circuit ("IC"), comprising:
a configurable logic block capable of performing a logic function; and
a programmable interconnect element coupled to said configurable logic block, said programmable interconnect element configured to have a multiplexer capable of facilitating to configure said configurable logic block, wherein said multiplexer includes:
a plurality of inputs;
an output;
a plurality of input-output paths that are selectively coupled between said plurality of inputs and said output, each input-output path including an active device with a control terminal; and
a plurality of nonvolatile reconfigurable devices coupled to the control terminals of said multiplexer,
wherein programmed resistance values of said plurality of nonvolatile reconfigurable devices determine which of the inputs of said plurality of inputs is coupled to said output.

23. The IC of claim 22 wherein said plurality of nonvolatile reconfigurable devices comprises a plurality of phase change material devices.

24. The IC of claim 22 wherein said plurality of nonvolatile reconfigurable devices comprises a plurality of programmable metallization cells.

25. The IC of claim 22 wherein said plurality of nonvolatile reconfigurable devices comprises a plurality of nano-electromechanical devices.

26. The IC of claim 22 wherein the active devices included in said plurality of input-output paths comprise a plurality of transistors.

* * * * *